(12) United States Patent
Bersch et al.

(10) Patent No.: US 7,024,654 B2
(45) Date of Patent: Apr. 4, 2006

(54) SYSTEM AND METHOD FOR CONFIGURING ANALOG ELEMENTS IN A CONFIGURABLE HARDWARE DEVICE

(75) Inventors: Danny Austin Bersch, Gilbert, AZ (US); Ian Craig Macbeth, Alsager (GB); Howard C. Anderson, Tempe, AZ (US); Brian Eugene Nottingham, Tempe, AZ (US); Troy Franklin Giles, Mesa, AZ (US); Timothy James Streit, Mesa, AZ (US)

(73) Assignee: Anadigm, Inc., Tempe, AZ (US)

( * ) Notice: Subject to any disclaimer, the term of this patent is extended or adjusted under 35 U.S.C. 154(b) by 113 days.

(21) Appl. No.: 10/171,334

(22) Filed: Jun. 11, 2002

(65) Prior Publication Data

US 2003/0229877 A1    Dec. 11, 2003

(51) Int. Cl.
*G06F 17/50*    (2006.01)
(52) U.S. Cl. .............................. 716/16; 716/17; 716/18
(58) Field of Classification Search .................... 716/1, 716/2, 16–18; 703/13–17, 21–22, 28; 714/32–33; 326/39–45; 712/35, 41
See application file for complete search history.

(56) References Cited

U.S. PATENT DOCUMENTS

| | | | | |
|---|---|---|---|---|
| 5,493,672 A | * | 2/1996 | Lau et al. ....................... | 703/21 |
| 5,583,450 A | * | 12/1996 | Trimberger et al. ........... | 326/41 |
| 5,598,344 A | * | 1/1997 | Dangelo et al. ............... | 716/18 |
| 5,737,235 A | * | 4/1998 | Kean et al. ..................... | 716/16 |
| 5,745,734 A | * | 4/1998 | Craft et al. ..................... | 716/16 |
| 5,794,062 A | | 8/1998 | Baxter ...................... | 395/800.3 |
| 5,838,165 A | | 11/1998 | Chatter .......................... | 326/38 |

(Continued)

FOREIGN PATENT DOCUMENTS

WO    WO95/32478    11/1995

OTHER PUBLICATIONS

"An FPGA/FPAA-Based Rapid Prototyping Environment for Mixed Signal Systems", by Sree Ganesan and Ranga Vemuri, undated, Lab for Digital Design Environments; U of Cincinnati.

(Continued)

*Primary Examiner*—Matthew Smith
*Assistant Examiner*—Naum Levin
(74) *Attorney, Agent, or Firm*—Wells St. John P.S.

(57) ABSTRACT

A system is provided for programming a configurable semiconductor device. The system includes a programmable controlling device, a programmable computing device, a communication link, a configurable hardware device, a design tool with first computer program code, and second computer program code. The configurable hardware device has memory with a plurality of memory locations and coupled with the programmable controlling device via the communication link. The design tool includes first computer program code embodied in a programmable computing device. The second computer program code is generated at least in part by the first computer program code and is embodied in the programmable controlling device for: a) applying configuration data to selected memory locations within the configurable hardware device to configure the configurable hardware device; b) determining a location of a subset of at least one of (i) the programmable memory locations in the configurable hardware device and (ii) the configuration data to be modified; and c) determining a new data value to be applied to the subset of at least one of (i) the memory locations in the configurable hardware device and (ii) the configuration data. The design tool provides at least one of configuration data, address data, and a data value algorithm usable in performing at least one of a), b), and c). A method is also provided.

82 Claims, 17 Drawing Sheets

U.S. PATENT DOCUMENTS

| | | | | |
|---|---|---|---|---|
| 5,841,967 | A | * 11/1998 | Sample et al. | 714/33 |
| 5,931,959 | A | 8/1999 | Kwiat | 714/48 |
| 5,966,534 | A | 10/1999 | Cooke et al. | 395/705 |
| 6,006,022 | A | * 12/1999 | Rhim et al. | 716/1 |
| 6,041,400 | A | * 3/2000 | Ozcelik et al. | 712/35 |
| 6,053,951 | A | * 4/2000 | McDonald et al. | 717/109 |
| 6,058,469 | A | 5/2000 | Baxter | 712/43 |
| 6,091,263 | A | 7/2000 | New et al. | 326/40 |
| 6,092,174 | A | 7/2000 | Roussakov | 712/15 |
| 6,150,839 | A | 11/2000 | New et al. | 326/40 |
| 6,182,206 | B1 | 1/2001 | Baxter | 712/43 |
| 6,230,307 | B1 | 5/2001 | Davis et al. | 716/16 |
| 6,255,849 | B1 | * 7/2001 | Mohan | 326/41 |
| 6,260,139 | B1 | 7/2001 | Alfke | 713/1 |
| 6,272,669 | B1 | 8/2001 | Anderson et al. | 716/16 |
| 6,288,566 | B1 | 9/2001 | Hanrahan et al. | 328/38 |
| 6,304,101 | B1 | 10/2001 | Nishihara | 326/41 |
| 6,308,253 | B1 | * 10/2001 | Gadre et al. | 712/41 |
| 6,308,311 | B1 | 10/2001 | Carmichael et al. | 716/16 |
| 6,314,553 | B1 | 11/2001 | Stevens et al. | 716/18 |
| 6,324,676 | B1 | 11/2001 | Burnham et al. | 716/16 |
| 6,326,806 | B1 | 12/2001 | Fallside et al. | 326/38 |
| 6,327,253 | B1 | 12/2001 | Frink | 370/260 |
| 6,339,827 | B1 | 1/2002 | Stokes et al. | 713/176 |
| 6,346,824 | B1 | 2/2002 | New | 326/39 |
| 6,356,862 | B1 | * 3/2002 | Bailey | 703/16 |
| 6,357,037 | B1 | 3/2002 | Burnham et al. | 716/17 |
| 6,438,737 | B1 | * 8/2002 | Morelli et al. | 716/16 |
| 6,584,601 | B1 | * 6/2003 | Kodosky et al. | 716/4 |
| 2001/0025231 | A1 | 9/2001 | Kodosky et al. | 703/13 |

OTHER PUBLICATIONS

"Configuration Code Generation and Optimizations for Heterogeneous Reconfigurable DSPS", pp. 169-180 by Suet-Fei Li, et al., I Signal Processing Systems, 1999, SIPS 99, 1999 IEEE Workshop, Taipei, Taiwan, Oct. 20-22, 1999.

Dynamically Reconfigurable Analog/Digital Hardware—Implementation Using FPGA and FPAA Technologies, by Cornel Reiser, et al., International Winter Conference of the Society for Computer Simulation, Jan. 17-19, 1999.

"JPG—A Partial Bistream Generation Tool to Support Partial Rconfiguration in Virtex FPGAs", by Anup Kumar Raghavan, et al., Parallel and Distributed Processing Symposium, Proceedings International, IPDPS 2002, Apr. 15-19, 2002.

"Design Methodology of a Low-Energy Reconfigurable Single-Chip DSP System", by Marlene Wan, et al., pp. 47-61, Journal of VLSI Signal Processing Systems for Signal Image and Video Technology, vol. 28 No. 1/2, May 2001.

* cited by examiner

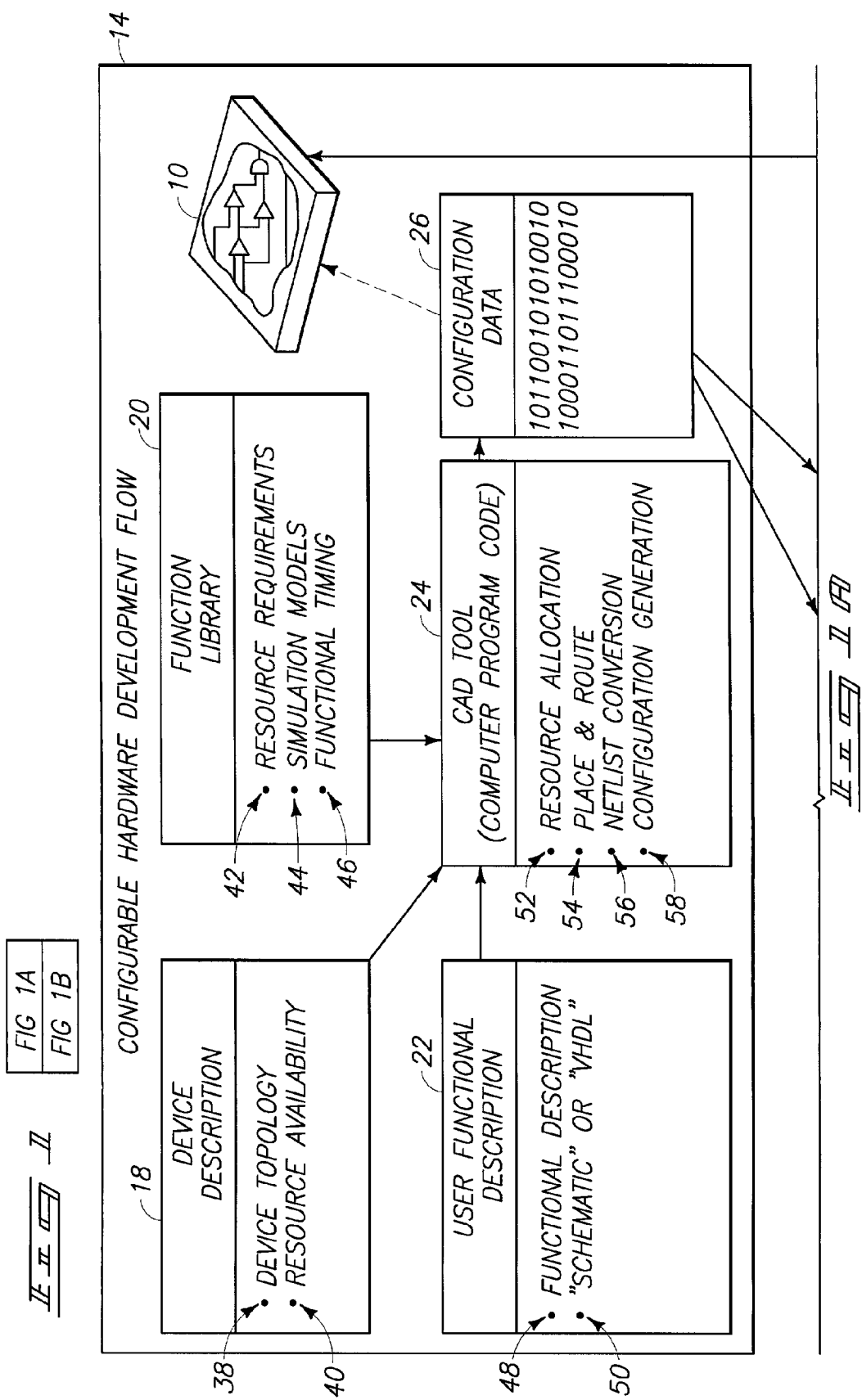

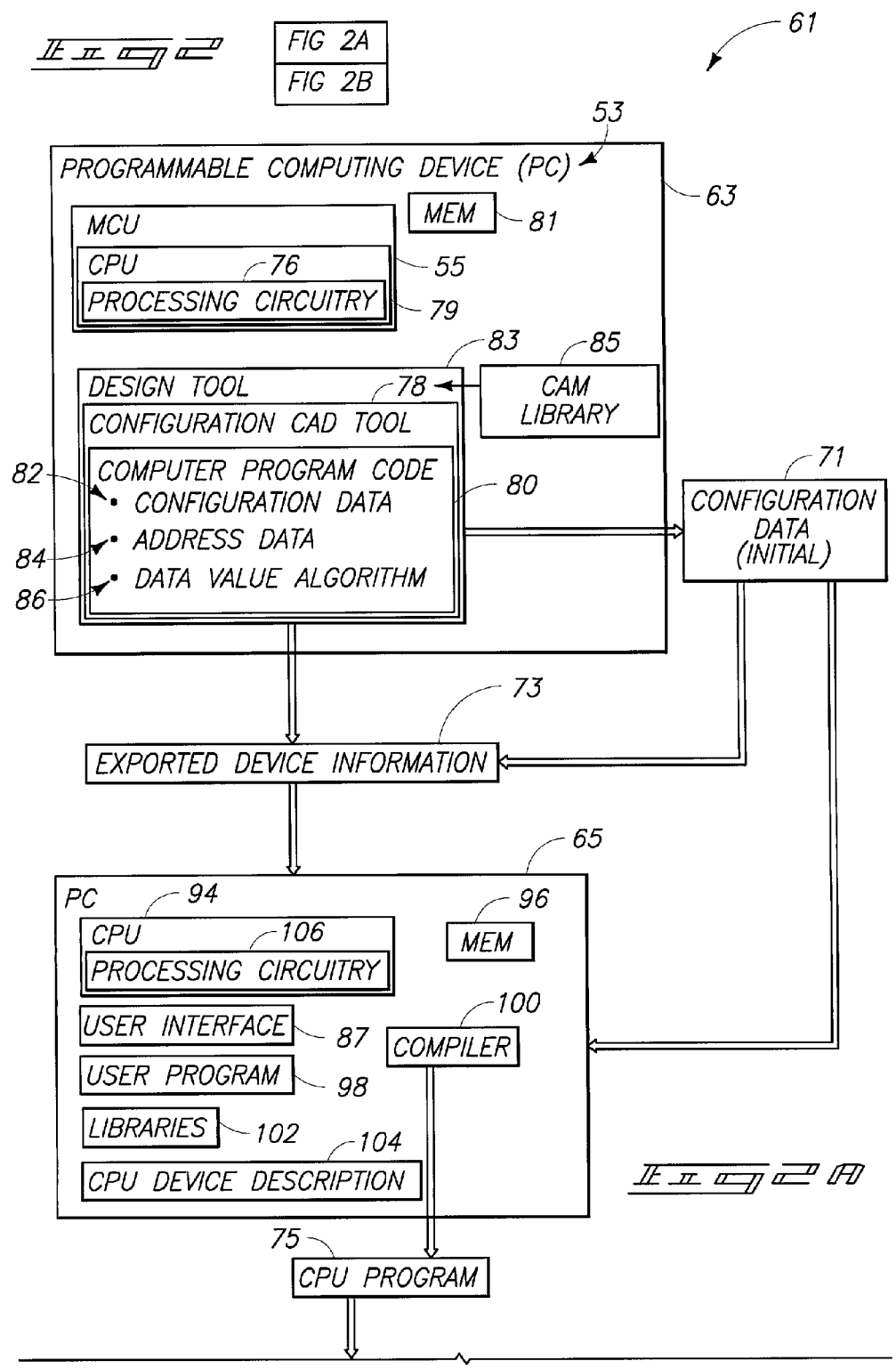

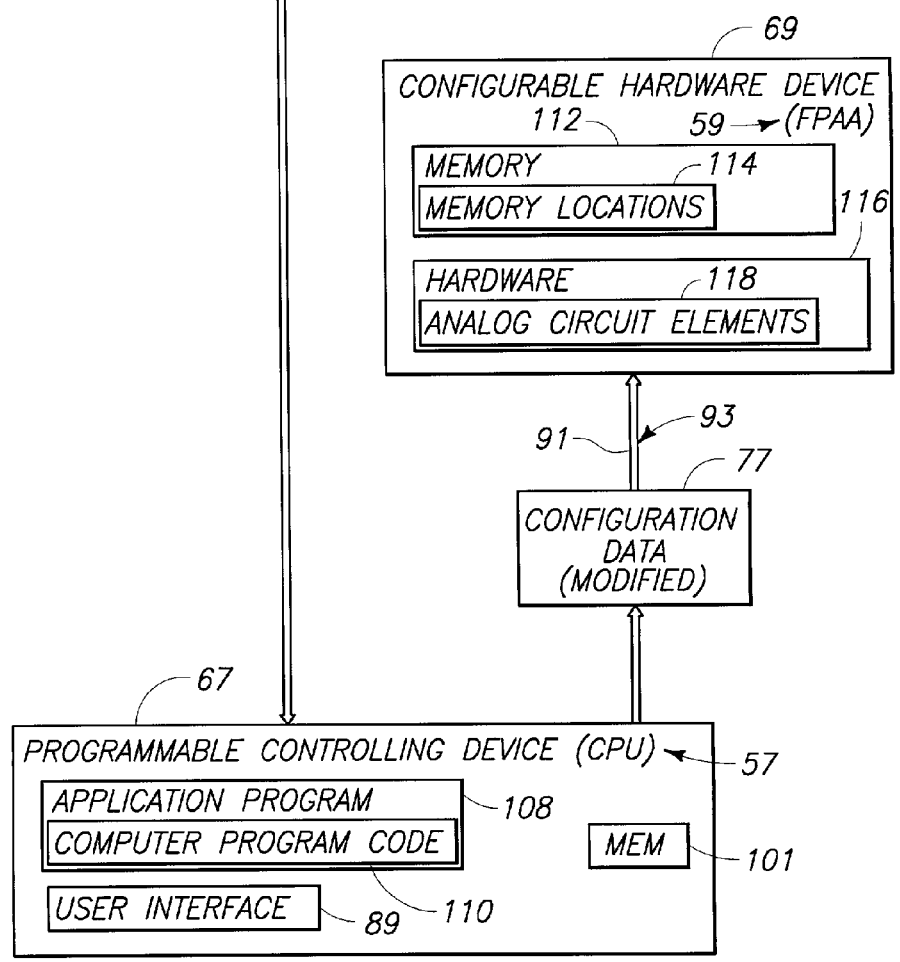

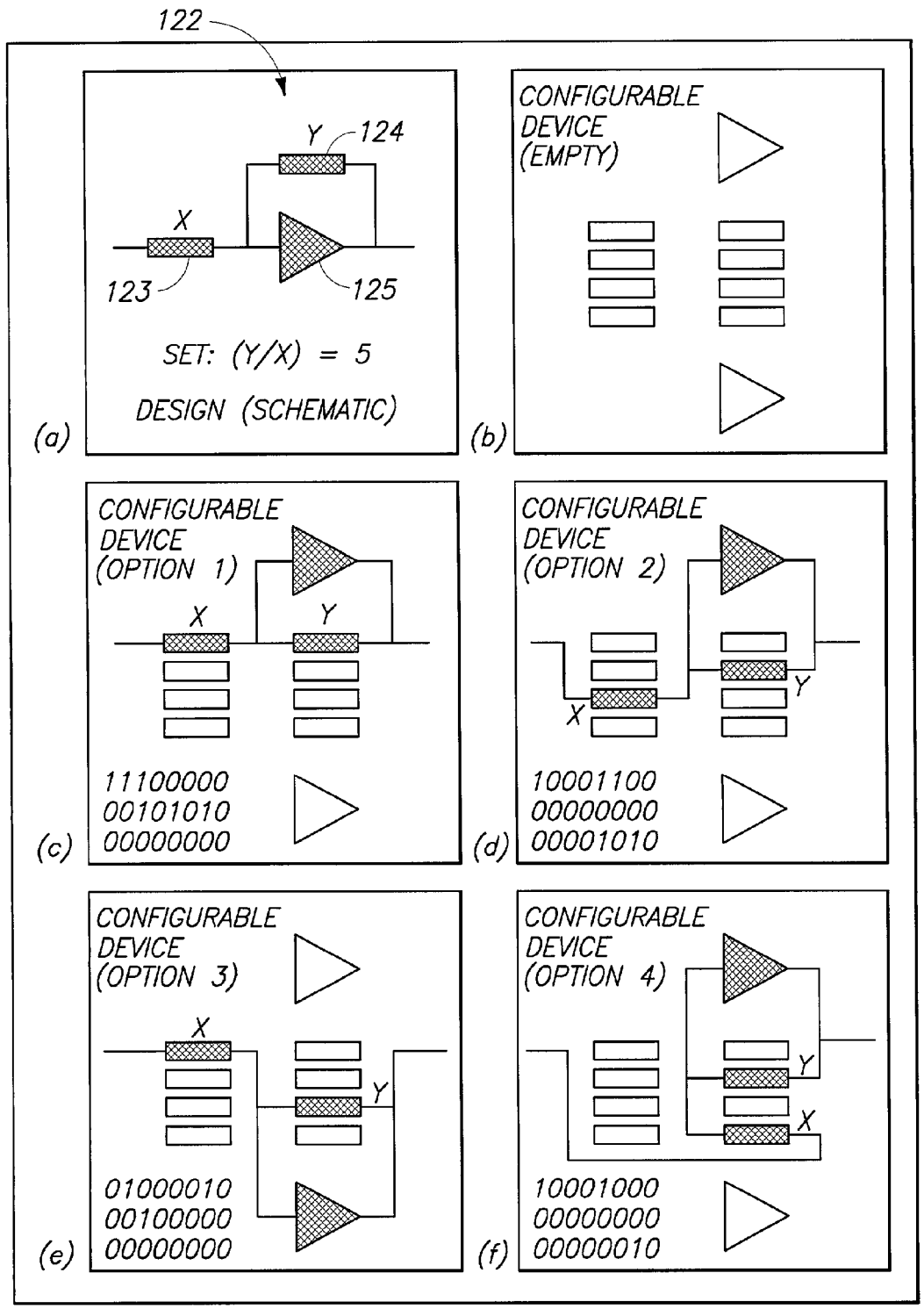

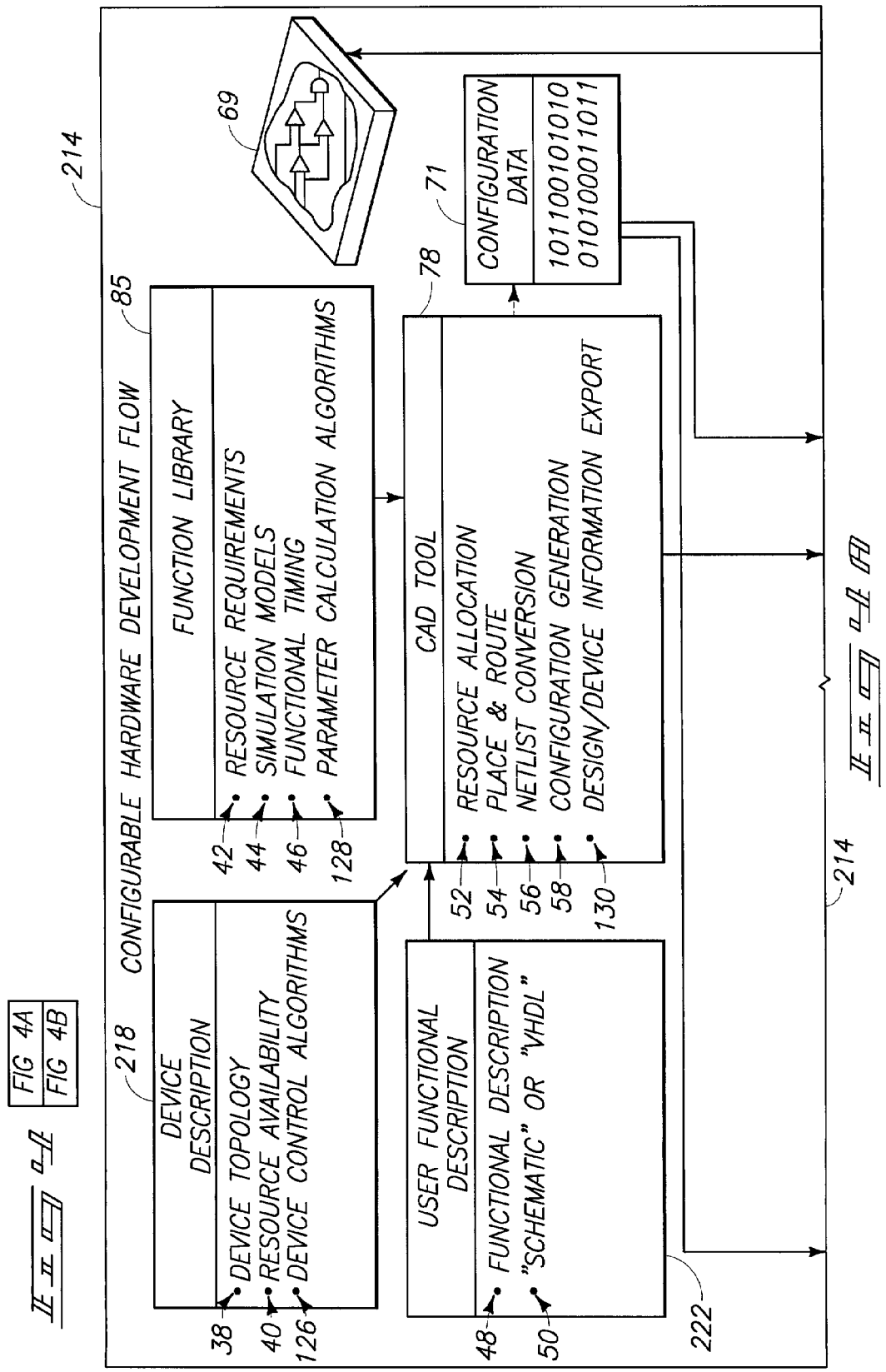

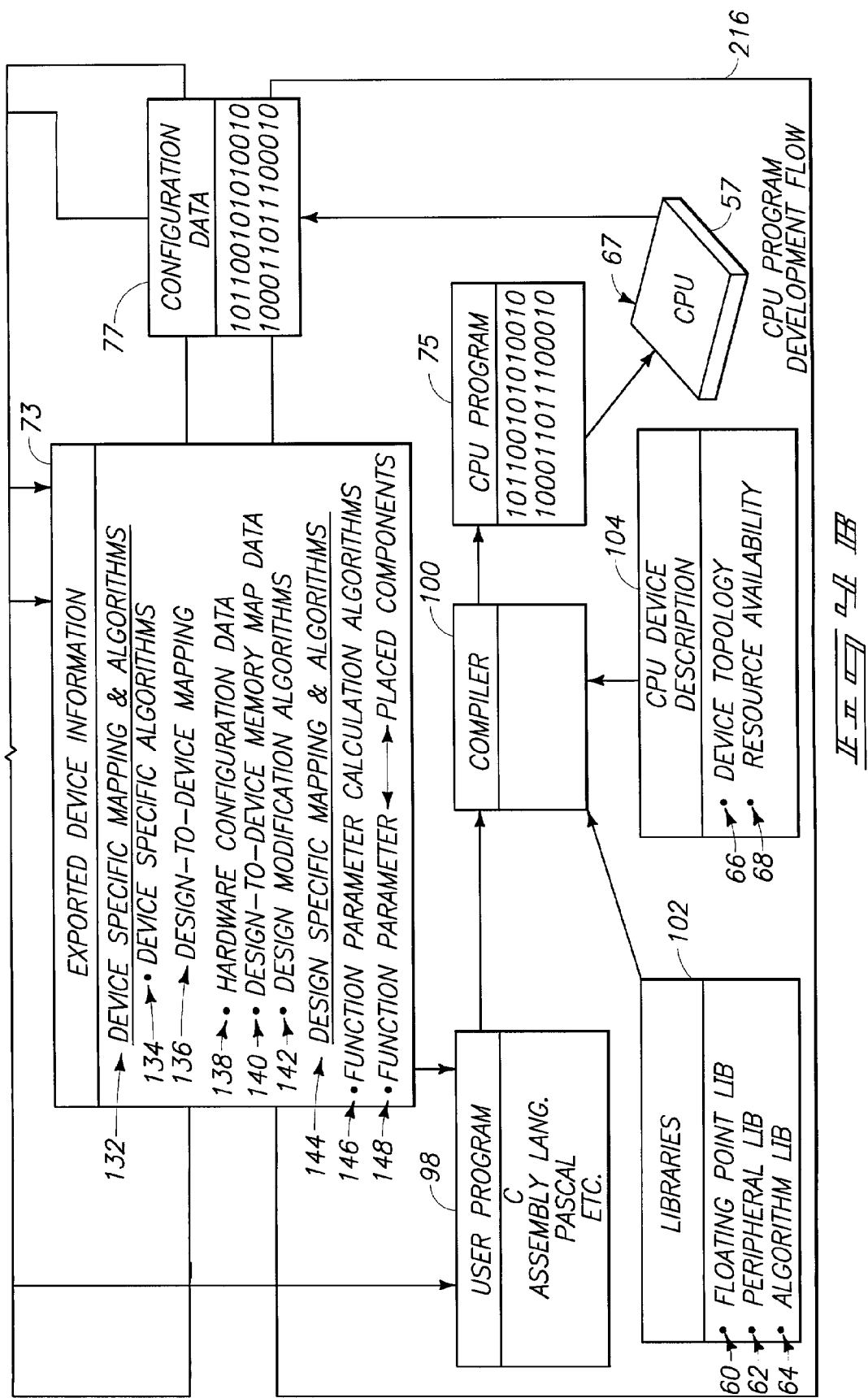

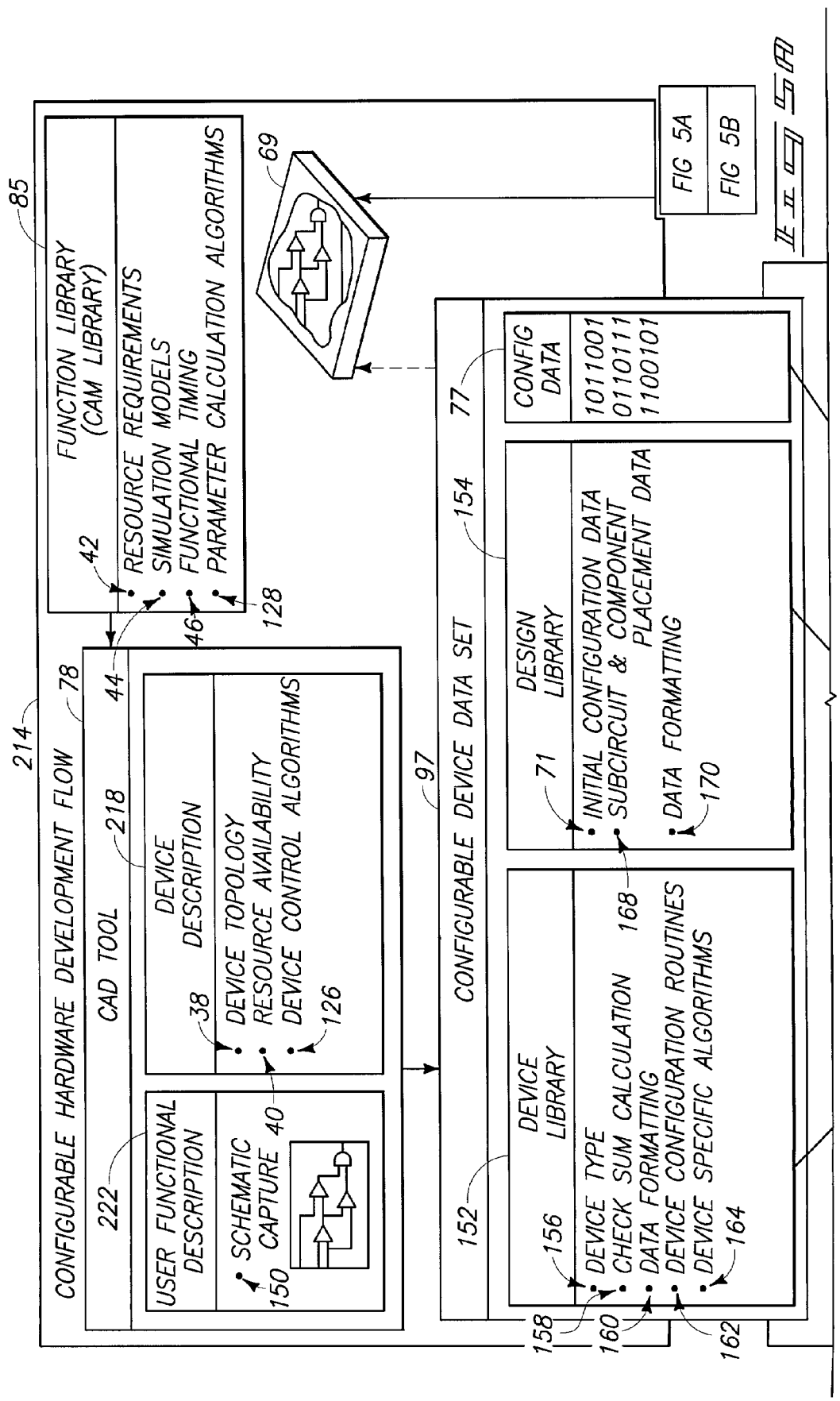

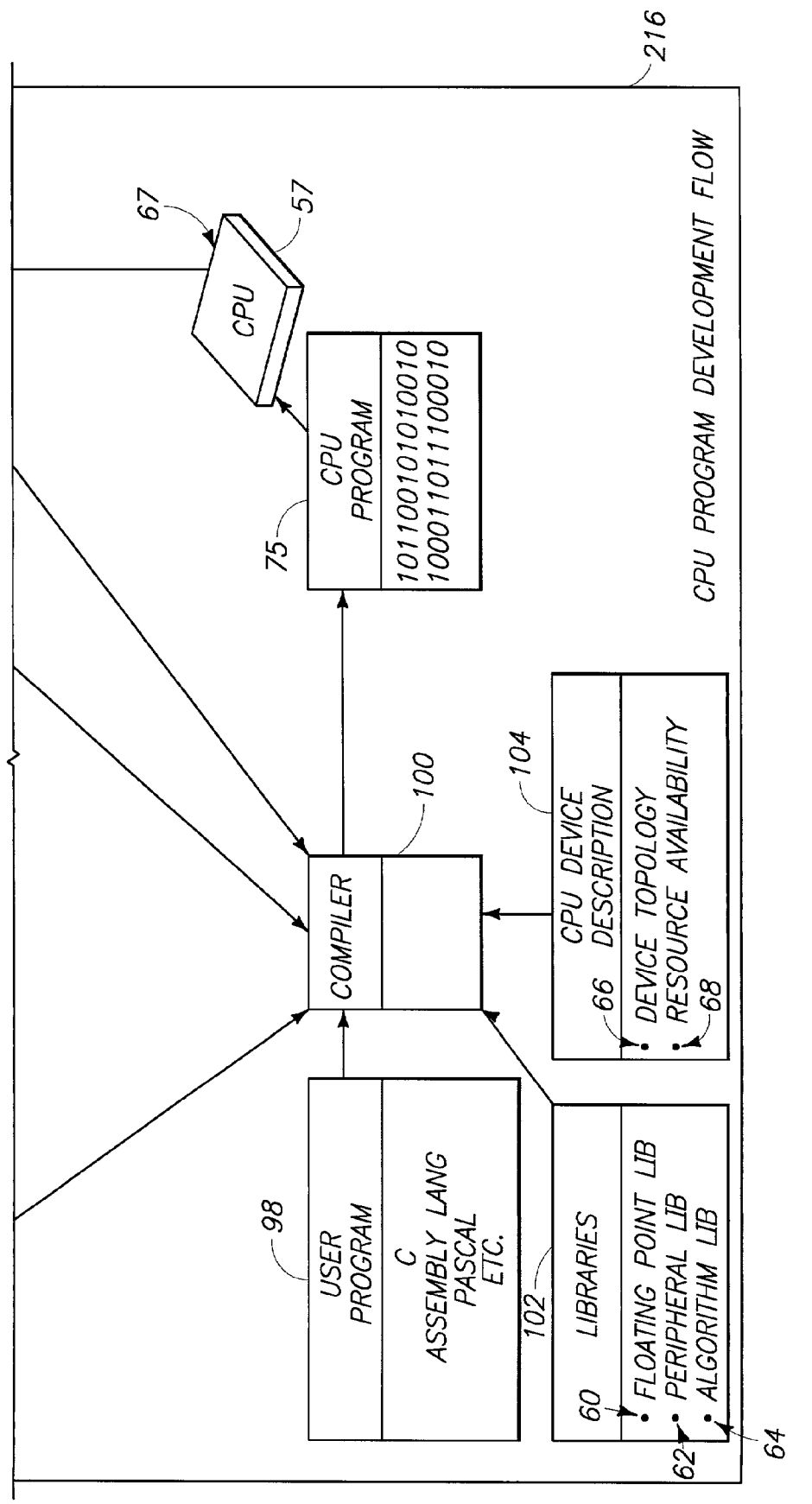

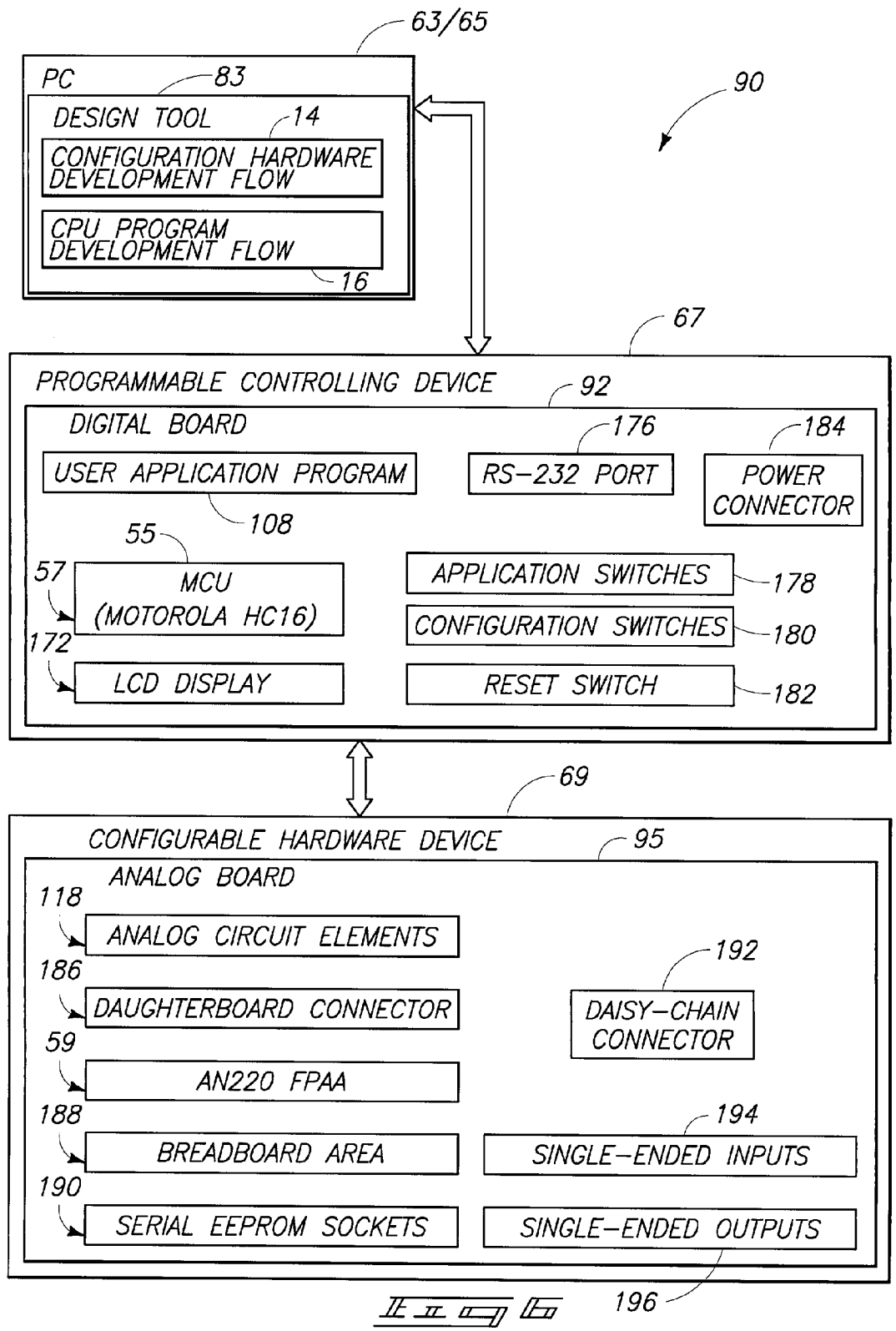

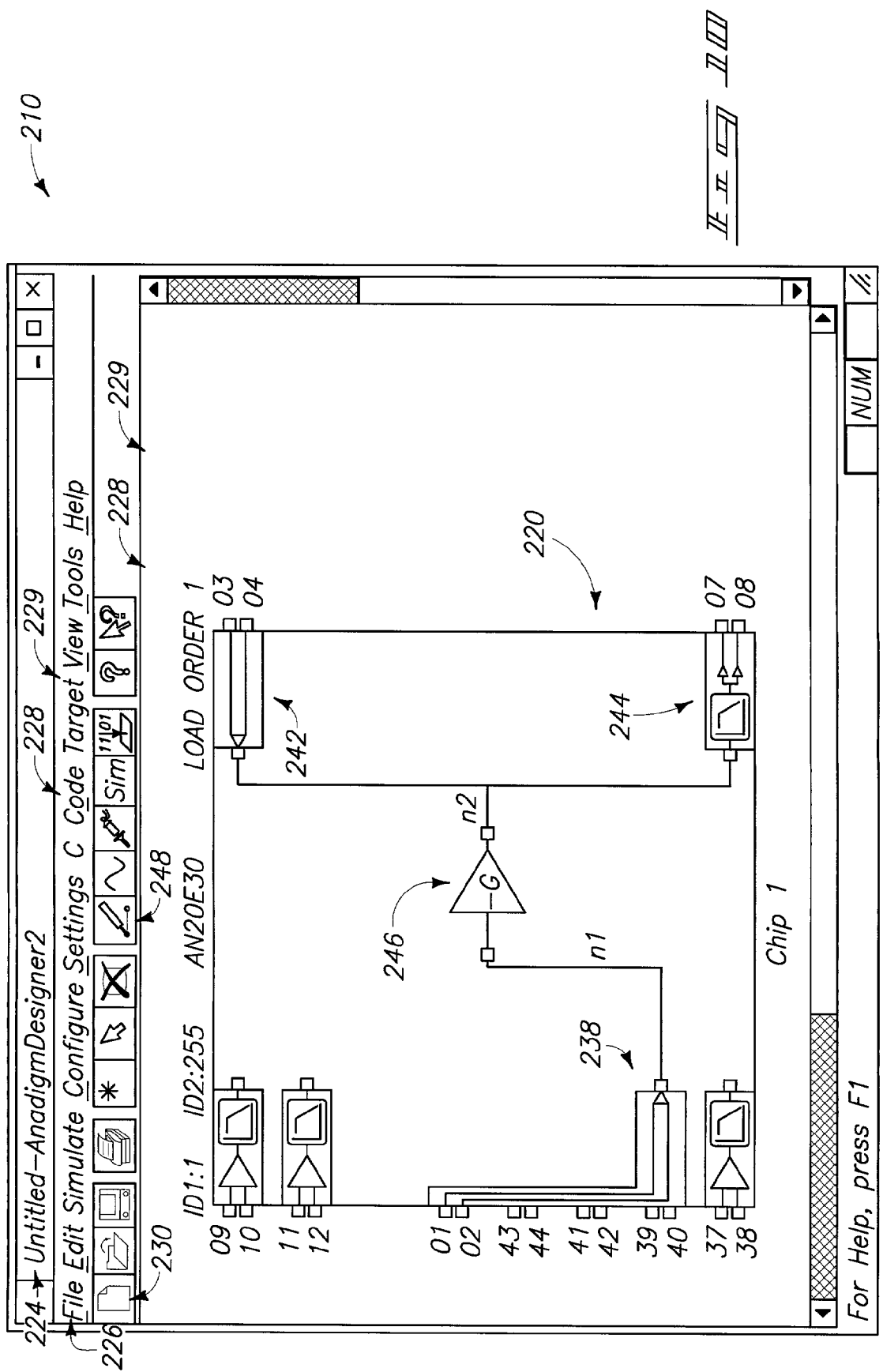

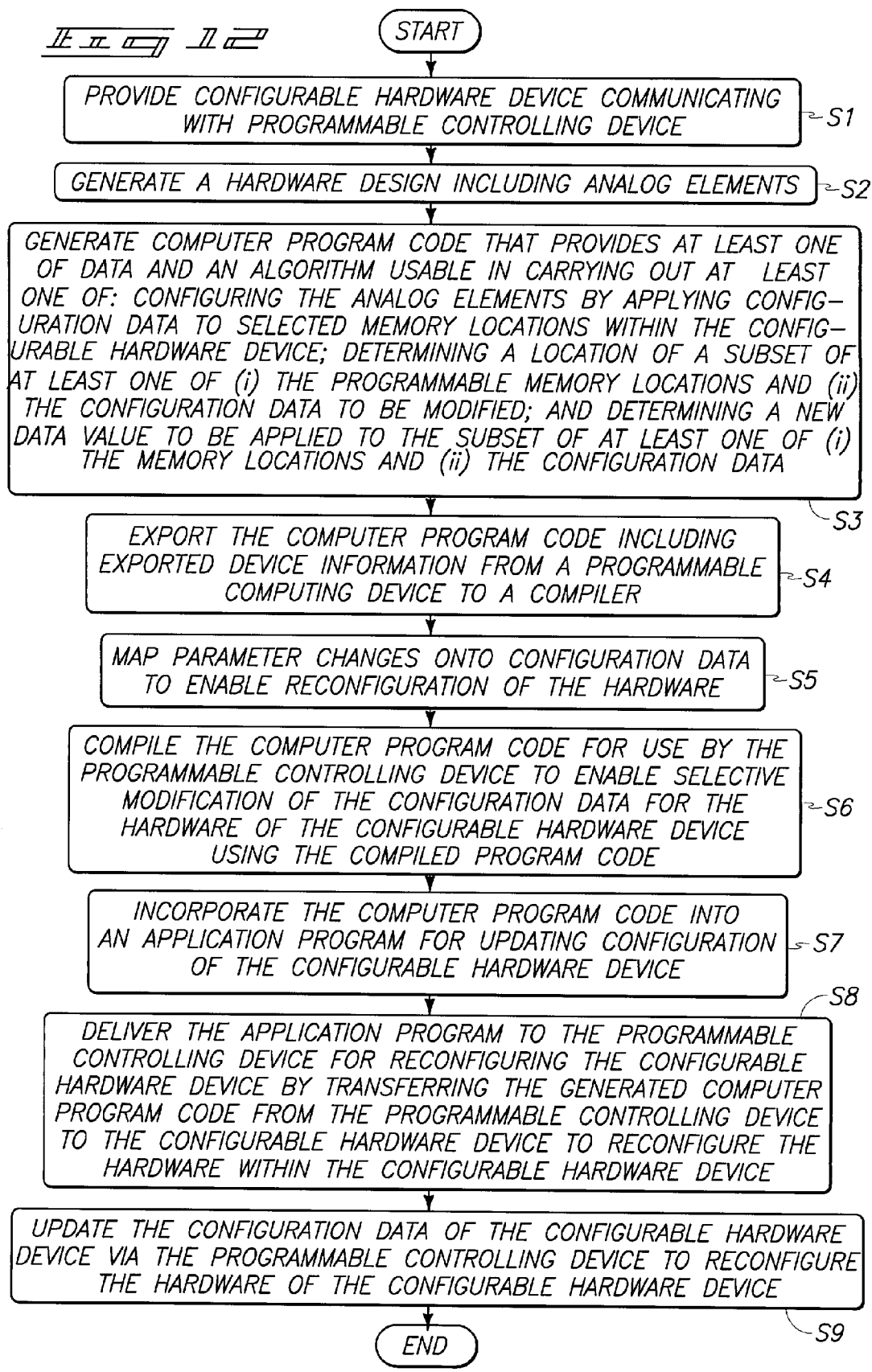

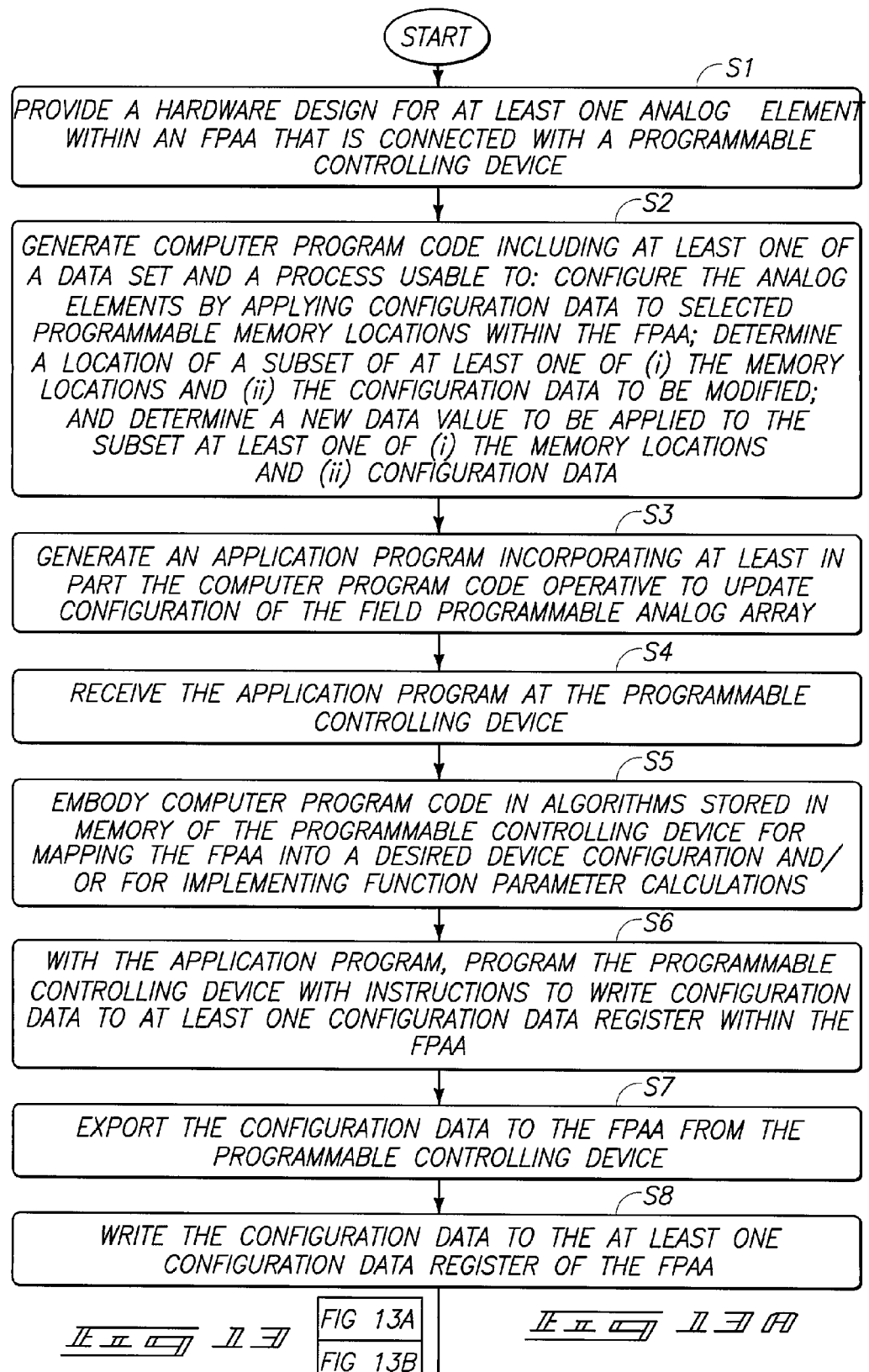

SYSTEM AND METHOD FOR CONFIGURING ANALOG ELEMENTS IN A CONFIGURABLE HARDWARE DEVICE

TECHNICAL FIELD

This invention pertains to configurable devices. More particularly, this invention relates to programmable, configurable devices such as reconfigurable devices wherein software is developed for programming a first configurable device using a second configurable device.

CROSS-REFERENCE TO COMPUTER PROGRAM LISTING APPENDIX

CD-ROM Appendix A, which is part of the present disclosure, is a CD-ROM appendix consisting of 13 files. CD-ROM Appendix A is a computer program listing appendix that includes a software program. Appendix A is incorporated herein by reference. The total number of CD-ROMs including duplicates is two, each of which includes 13 files, as follows:

| Name | Size | Created |
| --- | --- | --- |
| 916Y3.H | 42,479 | Mar. 12, 2002 |
| AN20E30.C | 7,159 | Mar. 12, 2002 |
| AN20E30.H | 232 | Mar. 12, 2002 |
| APICODE.C | 37,721 | Mar. 12, 2002 |
| APICODE.H | 31,170 | Mar. 12, 2002 |
| GEDEMO.C | 24,051 | Mar. 12, 2002 |
| GENTYPES.H | 342 | Mar. 12, 2002 |
| IPMODU~1.C | 5,677 | Mar. 12, 2002 |
| IPMODU~1.H | 5,272 | Mar. 12, 2002 |
| LCDDISP.C | 15,755 | Mar. 12, 2002 |
| LCDDISP.H | 373 | Mar. 12, 2002 |
| QSPI.C | 3,608 | Mar. 12, 2002 |
| QSPI.H | 202 | Mar. 12, 2002 |

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

Configurable devices have grown in use and popularity. One example of a configurable device is a programmable device. Programmable devices have evolved to the point where it is now practical and desirable to configure one programmable device with another programmable device. For example, a micro-controller can be used to program a configurable hardware device such as a programmable logic device (PLD). Alternatively, a microprocessor, a field programmable gate array (FPGA), or a digital signal processor (DSP) chip may be used to program a field programmable analog array (FPAA), an FPGA, or a DSP chip.

In one case, configuration is accomplished by programming a first device to write configuration data to some or all of the configuration data registers within a second device. After configuring the second device, it is often desirable for the first device to be able to adjust any or all of the performance parameters of the second device. Additionally or optionally, it is desirable to change the overall circuit implemented in the second device. In both cases, the adjustment or change is carried out by either (a) modifying all or part of the configuration data, and then applying the configuration data to the registers within the second device or (b) by directly modifying all or part of the configuration data contained within the registers of the second device. However, current design tools have a difficult time carrying out this modification.

Present-day computer-aided design (CAD) tools for integrated circuits have been used to program configurable devices, but are designed to provide the ability to program a target device. However, such CAD tools have no provision for configuration of the device by or from another device. More particularly, circuit design flow typically uses internal algorithms in order to combine together the user's design, information about architecture of the device, and potentially one or more pre-defined elements. The design flow then delivers a configuration data set that is suitable for configuring the target device. This technique works relatively well when the configurable device is to be loaded in its entirety, such as when the device is being loaded from a read-only memory (ROM). However, use of this technique relegates a sophisticated controller to the task of merely loading one or more complete configurations into the configurable device (or chip) because the only portion of the original design information that is available when the controller code is compiled is the resulting raw configuration data.

FIG. 1 illustrates configurable hardware flow and controller flow for such a prior art system. More particularly, a configurable hardware device 10 having analog components is provided in a manner that can be configured by a controlling device 12, such as a central processing unit (CPU). Configurable hardware flow 14 is illustrated in relation to controller flow 16 wherein a device description 18, a function library 20, a user functional description 22, and a CAD tool 24 interact such that the CAD tool generates configuration data 26. Such configuration data is then exported to configurable device 10. By way of an example, one way of doing this involves storing data in a read only memory (ROM) and allowing a field programmable analog array (FPAA) to configure directly from the ROM. Furthermore, configuration data 26 is further delivered to controller flow 16.

With respect to controller flow 16, a user program 28, libraries 30, CPU device description 32, and a compiler 34 interact such that compiler 34 generates a CPU program 36. Compiler 34 receives configuration data 26 from configurable hardware flow 14 and/or indirectly via user program 28. CPU program 36 is delivered to controlling device 12, after which controlling device 12 uses internal algorithms to combine a user's design, information about the device architecture, and pre-defined elements. Controlling device 12 then delivers a configuration data set, or a program, to configurable device 10 that is suitable for configuring such device.

Device description 18 includes information about device topology 38, as well as information about resource availability 40. Function library 20 includes information about resource requirements 42, simulation models 44, and functional timing 46. User functional description 22 includes information about a functional description, as well as information about a "schematic" or "VHDL" (VHSIC Hardware Description Language). CAD tool 24 includes information about resource allocation 52, place & route information 54, netlist conversion information 56, and configuration generation information 58.

User program 28 can be provided in any of a number of programming languages including, but not limited to, "C" language, assembly language, and PASCAL. Libraries 30 include a floating point library 60, a peripheral library 62, and an algorithm library 64. CPU device description 32 includes information about device topology 66 and resource availability 68.

Existing CAD tools are provided with configuration data alone, and are not provided with details about device architecture and sub-circuit placement. Accordingly, any external program on a controlling device, such as controlling device 12, can do little more than blindly load the configurable hardware onto configurable device 10. In order for CPU program 36 to be rendered with the ability to make useful changes to circuitry or parameters within configurable device 10, additional information is required about where components are to be placed and the criteria for setting values for such components. However, presently known techniques are incapable of providing such information.

For example, conventional practice with some field programmable gate array (FPGA) designs allows a user to update only selected portions of an array within the FPGA. This activity is the functional equivalent of putting several smaller FPGAs within a single package. However, the associated configuration software still does not provide a user with information about the underlying configuration data, nor the effects of changing the data. Furthermore, the configuration software is incapable of mapping user-described parameter changes onto the configuration data.

As a second example, application notes have been published by vendors of micro-controllers and micro-controller peripherals for products that include sample source code listings. However, these source code listings are only capable of addressing configuration of hardwired options within a specific device, such as defining a port as either an input port or an outport port, or in order to set one of several pre-defined baud rates. Furthermore, such application notes are only applicable to fixed hardware and fixed functionality applications.

SUMMARY OF THE INVENTION

The present invention is a method and apparatus for providing information about where components are to be placed and to provide criteria for setting values of such components in a programmable device. The information and criteria are provided in a form that can be readily used in a design process flow of a programming device in order to allow local modification of configuration data for configurable components, or hardware, of the programmable, configurable device.

According to one aspect, a system is provided for programming a configurable semiconductor device. The system includes a programmable controlling device, a programmable computing device, a communication link, a configurable hardware device, a design tool with first computer program code, and second computer program code. The configurable hardware device has memory with a plurality of memory locations and coupled with the programmable controlling device via the communication link. The design tool includes first computer program code embodied in a programmable computing device. The second computer program code is generated at least in part by the first computer program code and is embodied in the programmable controlling device for: a) applying configuration data to selected memory locations within the configurable hardware device to configure the configurable hardware device; b) determining a location of a subset of at least one of (i) the programmable memory locations in the configurable hardware device and (ii) the configuration data to be modified; and c) determining a new data value to be applied to the subset of at least one of (i) the memory locations in the configurable hardware device and (ii) the configuration data. The design tool provides at least one of configuration data, address data, and a data value algorithm usable in performing at least one of a), b), and c).

According to another aspect, a system is provided for configuring a programmable device. The system includes a first programmable device, a second programmable device, a programmable computing device having a design tool with first computer program code, and a second computer program code. The second programmable device has configurable hardware and configuration data registers for configuring the configurable hardware. The second programmable device communicates with the first programmable device. The programmable computing device has a design tool with first computer program code for generating at least one of configuration data, address data, and algorithms. The second computer program code is generated at least in part by the first computer program code. The second computer program code incorporates at least one of the generated configuration data, address data, and algorithms for determining data values. The second computer program code is embodied in the first programmable device for: a) applying configuration data to selected memory locations within the configurable hardware device; b) determining a location of a subset of at least one of (i) the programmable memory locations in the configurable hardware device and (ii) the configuration data to be modified; and c) determining a new data value to be applied to the subset of at least one of (i) the memory locations and (ii) the configuration data.

According to yet another aspect, a method is provided for implementing configuration or reconfiguration of analog elements provided in a configurable hardware device. The method includes: providing a configurable hardware device communicating with a programmable controlling device; generating a hardware design including analog elements; generating computer program code that provides at least one of data and an algorithm usable in carrying out at least one of: configuring the analog elements by applying configuration data to selected memory locations within the configurable hardware device; determining a location of a subset of at least one of (i) the programmable memory locations and (ii) the configuration data to be modified; and determining a new data value to be applied to the subset of at least one of (i) the memory locations and (ii) the configuration data; incorporating the computer program code into an application for updating configuration of the configurable hardware device; and delivering the application to the programmable controlling device for reconfiguring the configurable hardware device.

According to even another aspect, a method is provided for configuring a field programmable analog array. The field programmable analog array is connected to a programmable controlling device. The method includes: providing a hardware design for at least one analog element within the field programmable analog array; generating computer program code including at least one of a data set and a process usable to: configure the analog elements by applying configuration data to selected programmable memory locations within the field programmable analog array; determine a location of a subset of at least one of (i) the memory locations and (ii) the configuration data to be modified; and determine a new data value to be applied to the subset of at least one of (i) the memory locations and (ii) the configuration data; generating an application program incorporating at least in part the computer program code operative to update configuration of the field programmable analog array; receiving the application program at the programmable controlling device; with the application program, programming the programmable controlling device with instructions to write configuration data to at least one configuration data register within the field programmable analog array; writing the configuration data to the at least one configuration data register of the field programmable analog array; and configuring hardware within the field programmable analog array in response to writing the configuration data to the at least one configuration data register.

One advantage according to the present invention is the provision of additional features to design and configuration software so that information required for close-coupled control is available for use in developing a controller program for a programmable controlling device used to reconfigure a configurable hardware device.

BRIEF DESCRIPTION OF THE DRAWINGS

Preferred embodiments of the invention are described below with reference to the following accompanying drawings.

FIGS. 1A–1B together illustrate a block diagram for a prior art system for configuring a semiconductor device and illustrating configurable hardware flow and controller flow.

FIGS. 2A–2B together illustrate a block diagram overview of a basic system configuration of an exemplary system for programming a configurable semiconductor device, according to one embodiment of the present invention.

FIG. 3 is a block diagram illustrating exemplary circuit designs for a hypothetical configurable hardware device depicting a desired circuit design with a simple design equation, an empty configurable device, and four possible configurations that can be constructed using a configuration program for the device, together with representative configuration data.

FIGS. 4A–4B together illustrate a block diagram for the system of FIG. 2 illustrating configurable hardware flow and controller flow.

FIGS. 5A–5B together illustrate a block diagram for the system of FIG. 4 further illustrating details of a configurable device data set that is directly imported by a user's 'C' compiler to create a program that can create modified configuration data for use in reconfiguring the configurable device.

FIG. 9 is a diagram of a screen display of a design tool application window within a user display.

FIG. 10 is a diagram of a screen display for the design tool application window of FIG. 9 and illustrating one example analog circuit generated using a design tool, and including an input port that performs the function of an analog multiplexor (MUX) of FIG. 8.

FIG. 12 is a process flow diagram showing the process stages for implementing configuration/reconfiguration of analog elements in a configurable hardware device by way of the system of FIGS. 2 and 4–5.

FIGS. 13A–13B together illustrate a process flow diagram showing the process stages for implementing configuration of a field programmable analog array (FPAA).

DETAILED DESCRIPTION OF THE PREFERRED EMBODIMENTS

Figure 1B:
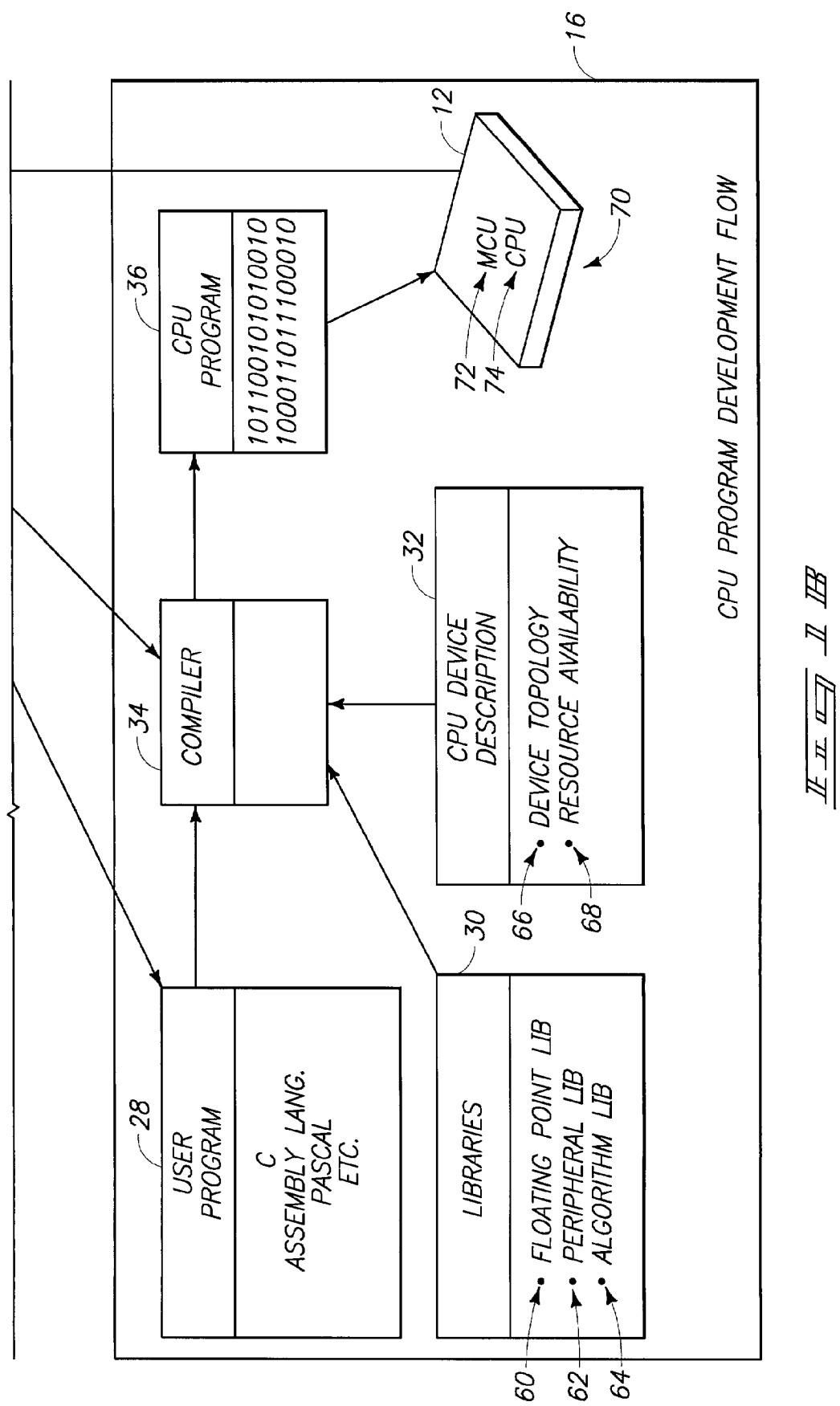

This disclosure of the invention is submitted in furtherance of the constitutional purposes of the U.S. Patent Laws "to promote the progress of science and useful arts" (Article 1, Section 8).

Reference will now be made to a preferred embodiment of Applicants' invention. One exemplary implementation is described below and depicted with reference to the drawings comprising a system and method for programming a configurable semiconductor device. While the invention is described by way of a preferred embodiment, it is understood that the description is not intended to limit the invention to such embodiment, but is intended to cover alternatives, equivalents, and modifications which may be broader than the embodiment, but which are included within the scope of the appended claims.

In an effort to prevent obscuring the invention at hand, only details germane to implementing the invention will be described in great detail, with presently understood peripheral details being incorporated by reference, as needed, as being presently understood in the art.

For purposes of this disclosure, the term "field programmable analog array (FPAA)" is understood to refer to an integrated circuit capable of being programmed and configured to implement analog circuits using programmable interconnections and an array of configurable analog blocks. More particularly, an FPAA includes a collection of analog circuit components and switches. The switches may be used to connect the components together in order to realize a particular circuit design. Switches are also used in order to set values of individual analog circuit components. By downloading a binary bitstream to the FPAA (or chip), the FPAA switches can be set, which in turn defines a particular circuit. Even relatively simple FPAAs have thousands of switches that are required to be set in order to realize a particular circuit design. Accordingly, improvements presented herein are employed in order to simplify the circuit design and switch setting problem. Furthermore, provision is made for simulating particular analog circuit designs.

For purposes of this disclosure, the term "C" code as used herein refers to a specific example of program code. It is understood that other specific program codes could also be used including PASCAL, Visual Basic, Fortran, as well as other known program codes.

According to previously known techniques, full custom integrated circuit design was relatively time-consuming and required extensive analog design expertise. Programmable devices and FPAAs, in particular, provide the ability to quickly produce and change circuits when given the proper data to program the array. According to such techniques, the generation of programming data is greatly simplified using computer aided design tools which represent the design in a manner familiar to the circuit designer, and which automatically generate the corresponding data to program the FPAA. The ability to modify or generate this programming in the absence of such computer aided design tools is limited, almost prohibitive. In a situation where, for example, a microprocessor adjacent to the FPAA was required to change aspects of the circuit function implemented by the FPAA, the circuit designer would require an intimate knowledge of array architecture, the design of circuits using the technology on which the FPAA has been built, and the construction of the specific data sequences to cause the FPAA to realize such circuits.

However, the above-described technique is very labor-intensive and so complex as to be difficult to implement. The improvements presented herein address this problem.

FIG. 2 illustrates a preferred embodiment of Applicants' invention wherein a basic system configuration is provided for programming a configurable semiconductor device, and is identified with reference numeral 61. System 61 includes a programmable computing device 63, such as a personal computer (PC) 53, another PC 65, a programmable controlling device 67, and a configurable hardware device 69.

As shown in FIG. 2, system 61 is implemented in a combination of software and hardware in a manner that enables programming of configurable hardware device 69 using programmable controlling device 67. More particularly, software is provided in the form of exported device information 73 for programming configurable hardware device 69 so that information that is required for close coupled control is made available for use in developing a controller program via central processing unit (CPU) program 75. Programmable controlling device 67 then makes modified configuration data 77 available to configurable hardware device 69 either by (a) modifying all or part of the configuration data, and then applying the configuration data to the registers within the configurable hardware device 69, or (b) directly modifying all or part of the configuration data contained within the registers of the configurable hardware device 69. Using configuration data 77, configurable hardware device 69 is programmed as a consequence of the software. Software aspects of the system generate, in addition to usual configuration data of prior art systems, code which may be used by a second configurable device in order to modify, in whole or in part, functionality of configurable hardware device 69.

Programmable computing device 63 includes a microcontroller unit (MCU) 55, memory 81, a design tool 83, and a configurable analog module (CAM) library 85. MCU 55 includes a central processing unit (CPU) 79 comprising processing circuitry 76.

Design tool 83 comprises AnadigmDesigner2. An earlier version, AnadigmDesigner, is presently publicly available for download and use at http://www.anadigm.com from Anadigm Ltd., United Kingdom, and is herein incorporated by reference. A future release version will include aspects of the present invention which are added to the above-referenced earlier version of AnadigmDesigner, details of which are described below.

As shown in FIG. 2, design tool 83 includes a configuration computer-aided design (CAD) tool 78. Configuration CAD tool 78 includes computer program code 80 including configuration data 82, address data 84, and one or more data value algorithms 86.

PC 65 includes a central processing unit (CPU) 94, memory 96, a user interface 87, a user program 98, a compiler 100, libraries 102, and a CPU device description 104. CPU 94 includes processing circuitry 106.

Programmable controlling device 67 includes a user application program 108, memory 101, and a user interface 89. According to one embodiment, programmable controlling device 67 includes a central processing unit (CPU) 57. Application program 108 includes computer program code 110 for implementing software monitoring and control functions within the application system.

As shown in FIG. 2, configurable hardware device 69 comprises a field programmable analog array (FPAA) 59, according to such one embodiment. FPAA 59 includes memory 112, and hardware 116, such as microminiaturized, electronic circuits placed on a semiconductor device. Memory 112 includes memory locations 114 for receiving and storing configuration data for electrically configuring the hardware 116. Hardware 116 is constructed to be at least in part configurable such that its function can be dependent upon electrical states determined by configuration data held in memory 112. Hardware 116 includes analog circuit elements 118 for the processing of analog signals.

In operation, an initial set of configuration data 71 is generated by design tool 83. Configuration data 71 is provided via exported device information 73 to compiler 100. Additionally, or optionally, configuration data 71 is provided via user program 98 to compiler 100. Further details of methods for configuring a programmable semiconductor device are disclosed in U.S. Pat. No. 6,272,669 B1, entitled "Method for Configuring a Programmable Semiconductor Device", herein incorporated by reference.

According to one system configuration, configurable hardware device 69 includes a plurality of memory locations 114 in memory 112. Configurable hardware device 69 is coupled with programmable controlling device 67 via a communication link 91, such as a Serial Peripheral Interface (SPI) bus 93. In one case, computer program code 80 comprises first computer program code and computer program code 110 comprises second computer program code. The first computer program code is embodied in programmable computing device 63. The second computer program code is generated at least in part by the first computer program code. In one case, the second computer program code is generated completely by the first computer program code. However, this case is very unlikely. In another case, the second computer program code is generated partly by the first computer program code and partly by user input via user interface 87. For example, additional code can be provided to generate optional user interface 89 (of FIG. 2).

In operation, the second computer program code is embodied in the programmable controlling device 67 for configuring the configurable hardware device 69 by applying configuration data 77 to selected memory locations within the configurable hardware device 69. The second computer program code is also embodied in the programmable controlling device 67 for determining a location of a subset of programmable memory locations, such as memory locations 114, that are to be modified to contain new information relating to configuration. Even further, the second computer program code is embodied in programmable controlling device 67 for determining a new data value to be applied to the subset of the memory locations 114.

Instead of requiring hand programming, design tool 83 provides at least one of the configuration data, the address data, and a data value algorithm that is usable in performing at least one of the configuring, the determining of a location, and the determining of a new data value. In one case, design tool 83 automatically provides at least one of the configuration data, the address data, and the data value algorithm(s).

As will be discussed below with reference to FIGS. 4–6, programmable controlling device 67 provides a controlling device that is not limited to simply loading pre-compiled configurations into configurable hardware 116 of configurable hardware device 69. Instead, programmable controlling device 67 is imparted with information that is necessary to create modified configuration data in a dynamic operation, thereby not requiring hand coding by a programmer. For example, to change the gain parameter on a specific instance of a gain function the user is provided with the facility to simply call a software routine to set the gain for that gain function, whereas traditionally the user would have to (i) determine the new component values necessary to effect the new gain, (ii) deduce, by low-level analysis, the location of programming data, either in the device itself or in the configuration data, that is responsible for setting such component values and (iii) construct a mechanism in software whereby such replacement of data values can be effected. Furthermore, this result makes it possible to not only modify the performance parameters for a given base configuration of device 69, but to create configuration data for entirely new functionality for device 69. Alternatively, it also becomes possible to reallocate device resources in order to accomplish the same functionality, but in a different manner or layout. All of the preceding can be accomplished in real time and independently of the original configuration CAD tool 78.

In one case, programmable computing device 63, PC 65, and programmable controlling device 67 are provided by a single, common personal computer having a design tool 83. Alternatively, programmable computing device 63 and PC 65 are provided by a stand-alone computer-aided design computer and programmable controlling device 67 is provided by a micro-controller resident on an application board. Further alternatively, programmable computing device 63, PC 65, and programmable controlling device 67 are all provided as separate devices. Additionally, programmable controlling device 67 is close-coupled with configurable hardware device 69, according to one implementation.

According to various embodiments, programmable controlling device 67 comprises a microprocessor, a micro-controller, a field programmable gate array (FPGA), or a digital signal processor (DSP), to name a few. Also according to various embodiments, configurable hardware device 69 comprises a programmable logic device (PLD), a field programmable analog array (FPAA), a field programmable gate array (FPGA), or a digital signal processor (DSP), to name a few.

FIG. 3 illustrates exemplary circuit designs for a hypothetical configurable hardware device depicting a desired circuit design with a simple design equation, an empty configurable device, and four possible configurations that can be constructed using a configuration program for the device, together with representative configuration data. More particularly, a hypothetical configurable hardware device is represented by circuit layout 122, in Block (a) of FIG. 3. Circuit layout 122 includes a first circuit element "X" 123, a second circuit element "Y" 124, and a gain element 125. Additionally, a simple design equation is provided as: set (Y/X)=5. Block (b) depicts an empty configurable device. Blocks (c)–(f) depict several possible configurations that might be constructed by the configuration program for the hypothetical configurable hardware device depicted in Block (a). The remaining four blocks (c)–(f) are also depicted with representative configuration data. If the only information available is the configuration data, and if further details about device architecture and sub-circuit placement are not available, any external program can do little more than blindly load the configuration hardware. Any program that could make useful changes to the circuit or its parameters requires further information about where components are placed and the criteria for setting the values of such components. Accordingly, a method is needed to provide such type of information in a form that can be readily used in the design flow of a programming device in order to allow local modification of configuration data for configurable hardware.

FIG. 4 illustrates features that are added to the design and configuration software such that information required for close-coupled control is provided for use in developing a controller program. More particularly, software has been developed for programming a configurable device. The software generates, in addition to configuration data, code which may be used by a second configurable device in order to modify, in whole or in part, the function of the first device.

As shown in FIG. 4, configurable hardware development flow 214 is illustrated in relationship with CPU program development flow 216. A CAD 78 tool receives input in the form of a device description 218, a function library 85, and a user functional description 222. CAD tool 78 outputs configuration data 71 comprising a binary bitstream. Configuration data 71 is provided either to a user program 98 or a packet of exported device information 73.

Device description 218 includes information pertaining to device topology 38, information pertaining to resource availability 40, and device control algorithms 126.

Function library 85 includes information on resource requirements 42, simulation models 44, information on functional timing 46, and parameter calculation algorithms 128.

User functional description 222 includes a functional description 48 and a "schematic" or "VHDL" hardware representation 50.

CAD tool 78 includes information on resource allocation 52, place & route information 54, netlist conversion information 56, configuration generation information 58, and design/device information export details 130. Implementation of configurable hardware development flow 214 results in the generation of exported device information 73 which is delivered to user program 98 within CPU program development flow 216.

CPU program development flow 216 includes a user program 98, a compiler 100, libraries 102, CPU device description 104, CPU program 75, and a CPU 57.

User program 98 can be rendered in various programming languages, including "C" language, assembly language, PASCAL, or any other comparable programming language. Libraries 102 include a floating point library 60, a peripheral library 62, and an algorithm library 64. CPU device description 104 includes information on device topology 66 and information on resource availability 68.

In operation, user program 98 includes exported device information 73, and compiler 100 receives user program 98, libraries 102, and CPU device description 104 in order to compile, or translate, the resulting programs from a relatively high-level programming language (such as "C" language) into machine language. Compiler 100 first generates assembly language, then translates the assembly language into machine language. Accordingly, compiler 100 generates CPU program 75, comprising a bitstream output.

CPU program 75 is delivered to a programmable controlling device 67. In one form, programmable controlling device 67 is provided in the form of a CPU 57. In this case, programmable controlling device 67 processes the CPU program 75 in order to generate configuration data 77. Such configuration data 77 is then forwarded to configurable hardware device 69 in order to configure or reconfigure analog elements within configurable hardware device 69. As shown previously in FIG. 2, programmable controlling device 67 communicates with configurable hardware device 69 via a communication link 91, such as an SPI bus 93.

Exported device information 73 includes device specific mapping information and algorithms 132, as well as design specific mapping information and algorithms 144. Device specific mapping information and algorithms 132 includes device specific algorithms 134, design-to-device mapping information 136, hardware configuration data 138, design-to-device memory map data 140, and design modification algorithms 142. Design specific mapping information and algorithms 144 includes function parameter calculation algorithms 146 and relationship mapping information between the placement of function parameters and placed components 148. Further details are provided below with reference to FIG. 5.

Function library 85 includes information on resource requirements 42, simulation models information 44, functional timing information 46, and parameter calculation algorithms 128.

CAD tool 78 includes a user functional description 222 and a device description 218. User functional description 222 includes schematic capture information 150. Device description 218 includes information on device topology 38, resource availability information 40, and device control algorithms 126.

As shown in FIG. 5, function library 85 provides input in the form of configurable analog modules (CAMs) within a CAM library to CAD tool 78, all within the configurable hardware development flow 214. CAD tool 78 generates a configurable device data set 97 which is initially provided to configurable hardware device 69 or is provided directly to compiler 100 within CPU program development flow 216. Configurable device data set 97 provides a subset of exported device information 73 (of FIG. 4). Configurable device data set 97 includes a device library 152, a design library 154, and configuration data 77.

Device library 152 includes information about a device type 156, check sum calculation information 158, data formatting information 160, device configuration routines information 162, and device specific algorithms 164.

Design library 154 includes initial configuration data 71, sub-circuit and component placement data 168, and data formatting information 170.

Details of user program 98, compiler 100, libraries 102, CPU device description 104, and CPU program 75 are similar to those depicted with reference to FIG. 4.

Software enhancement of FIG. 5 is implemented by way of algorithms that are provided within the CAMs within function library 85, as well as within program code routines and CAD software provided within CAD tool 78. More particularly, algorithms within the CAMs are operative to describe algorithms necessary to translate user specified parameters into component values and topologies. According to one implementation, such algorithms are implemented as "C" language routines. However, they could equally well be presented in any high-level language, or even compiled as object code. These code routines are generated specifically in order to implement modification of circuits generated by a user during the design phase of a circuit design.

A set of code routines implement basic functions such as configuration data assembly, check sum recreation, relocation of functions within the device, and calculation routines that are often used.

CAD software within CAD tool 78 combines place & route information with the previously mentioned set of code routines in order to generate a set of codes specific to the circuit implemented by the configuration data. The generated set of codes may be directly imported by a user's "C" compiler (such as compiler 100) in order to create a CPU program 75 that can create modified configuration data for use in reconfiguring configurable hardware device 69 via programmable controlling device 67.

According to the above techniques, a method is provided for designing a circuit by assembling a group of sub-assembly circuits (or subcircuits) within a CAD tool, such as CAD tool 78 (of FIG. 5). Once designed, the circuit can be realized in a programmable device, such as an FPAA. CAD tool 83 (of FIG. 5) provides a mechanism for translating the circuit design into properly formatted data that is needed in order to program the device. Sub-assembly circuits that can be assembled in the CAD tool are compatible with the CAD tool, but are not an integral part of the CAD tool. The sub-assembly circuit definitions are portable individually, or in groups. Accordingly, sub-assembly circuit definitions can easily be created or modified in order to change their functionality, while maintaining compatability with the CAD tool.

The sub-assembly circuit definitions contain information about the sub-assembly circuits needed in order to perform several things. The sub-assembly circuit definitions contain information needed to define multiple configurations, topologies and parameters of the sub-assembly circuit.

Additionally, information in the form of algorithms may be realized in a manner that, when combined with data stored in the CAD tool and data taken from user interfaces run by the CAD tool, returns the desired information to the CAD tool. For example, the information about modifying configurations of a sub-assembly circuit in response to user selections is handled in this manner.

Accordingly, CAD tool 83 of FIG. 5 has the ability to read data contained in the sub-assembly circuit definition; provide a user interface wherein the user can assemble the sub-assembly circuits into larger circuits; provide a user interface for each sub-assembly circuit so that the user can change the configuration and/or behavior of that sub-assembly circuit; run interpreter code contained in the sub-assembly circuit definition; provide a user interface with functionality that is specific to a particular programmable device; set up and run a simulation using the circuit design and information contained in the sub-assembly circuit definitions; view the results of a simulation; transform the circuit design into properly formatted data in order to download the data to a programmable device; and facilitate download of the properly formatted data to a programmable device.

The above-described technique allows significant design expertise to be contained within the sub-assembly circuit definitions, including sub-assembly circuit topology, the relationship of sub-assembly circuit topology and component values to higher level parameters displayed by the user interface, and sub-assembly circuit performance as shown through simulation. The sub-assembly circuit definitions, together with the CAD tool, contain specific details of the programmable device architecture. Accordingly, a person utilizing this technique is not required to be an expert in circuit design or the programmable device, but can work in a higher level of abstraction represented by the user interfaces of the sub-assembly circuits and the CAD tool. This makes the design of circuits and translation of those circuits to a proper format for programming an FPAA chip both quick and easy.

As shown in FIG. 5, algorithms within the CAMs of function library 85 are operative to describe algorithms necessary to translate user specified parameters into component values and topologies. Essentially, inside each CAM there exists a small segment of programming code which provides the core of the algorithm. When generating application programming interface (API) source code, all the small segments of programming code relating to specific CAMs are collected and integrated into the resulting design. Essentially, the small segments of source code are assembled such that AnadigmDesigner2 creates a group of API source code files comprising a collection of all the source code segments derived from those which exist inside the respective CAMs of the circuit design. It also includes other useful system-level function definitions and memory map information, as described below. Such programming code segments are collected together into a set of API source code files that are assembled together and put into a form that is ready to be compiled into a resulting application program, represented by CPU program 75 (of FIG. 5).

Each of the programming code segments is absolutely specific to the respective CAM that is being utilized in a circuit design, as well as to the overall circuit construction that is associated with such a CAM and to the architecture of the FPAA that will implement the circuit. If a user builds a circuit that includes three unique sub-assembly circuit components (or CAMs), each of such three functional devices would have their own function specific programming code segments which are extracted. All of such three functions will then exist as function definitions inside the CAM programming code file.

Specifically, AnadigmDesigner2 takes a particular circuit design that a user draws into schematic view (as represented in FIG. 10) and it composes the functions provided by a user from resources available within a silicon layout for the field programmable analog array. AnadigmDesigner2 actually chooses the topology using real resources, and determines which physical components will be used in order to realize the resulting circuit structure. Once AnadigmDesigner2 has determined which physical components are going to be used, AnadigmDesigner2 knows where they physically reside inside the FPAA (or chip). Accordingly, the addresses of memory locations which need to be updated are known.

As a user constructs a circuit, AnadigmDesigner2 assigns known low-level resources in the FPAA to implement it, and hence can describe the address of memory locations which program those resources. When the design is complete, it can generate both configuration data unique to that design and a collection of compilable "C" code files unique to that design which incorporates a hierarchy of function definitions containing algorithm information about how to reassign values to memory locations within the FPAA, and address information about where those corresponding memory locations are. The "C" code provides a very convenient means of invoking the algorithm and address information by using a simple high-level function call. When a user includes such a high-level function call in his own code, his software (when running) will automatically construct and issue a programming instruction to the FPAA to create the desired change to the circuit design.

Accordingly, the "C" code function combines the algorithm, calculates a new value, and contains other function calls which are prescriptive in terms of the memory address that needs to be updated and that is absolutely unique depending on the application.

For example, as AnadigmDesigner2 allocates for a particular sub-assembly circuit, for example, a capacitor that is present in a low-pass filter block, the capacitor will end up being somewhere in the device and its programming will have a particular address. However, AnadigmDesigner2 will not know that address until the circuit has been constructed. Once the address is known, that address location is physically reported and included into the "C" code as a number. When that "C" code is compiled and used for that particular design, that unique address is known and all the user has to do is call the function which says "Change the Gain", and the microprocessor which is running the compiled "C" code will construct the dynamic update data segment (which includes the target address for the new data and the data itself) and will convey that data to the FPAA, which will then modify its behavior accordingly.

1. Design Example

FIGS. 6–11, in combination with Appendix A, provide a design example for partial update of a field programmable analog array (FPAA).

The term "IPmodule" in Appendix A refers to a configurable analog module (CAM). A CAM is a software embodiment of a circuit function, such as an inverting gain function, to be realized in a configurable device (such as an FPAA).

By way of introduction, FIGS. 6–11, in combination with the following specification and Appendix A, describe the process for implementing partial update for a field programmable analog array in an embedded application. The purpose of this design example is to illustrate the relative ease with which CAMs can be updated using "C" code generated from AnadigmDesigner2, when configuring an Anadigm AN220E04 FPAA.

Pursuant to this design example, a process will be disclosed for first creating a design using AnadigmDesigner2. Secondly, a process will be disclosed for using AnadigmDesigner2 in order to generate "C" code. Finally, the process will disclose the incorporation of generated "C" code into an exemplary application.

Figure 6:
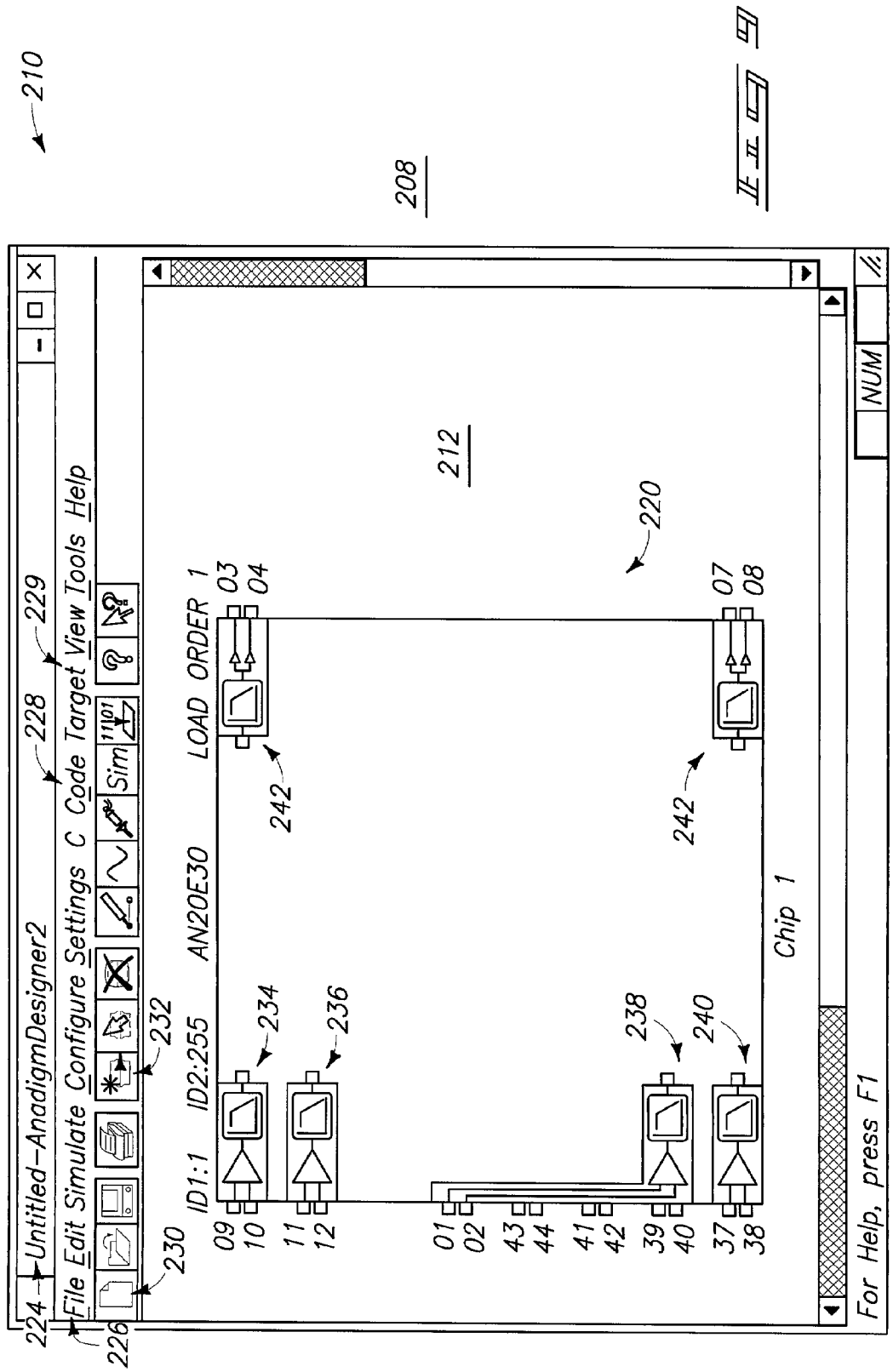
FIG. 6 is a block diagram illustrating an application system for running a user application for updating a configurable hardware device using computer program code generated via a design tool running on a programmable controlling device.

For purposes of this design example, an application environment is provided for running a user application in the form of Anadigm AN20PDS30 development system 90 as depicted in FIG. 6. Development system 90 includes a digital board 92 for running a user application program 108 and an analog board 95 for running analog circuitry (or analog circuit elements) 118.

As shown in FIG. 6, programmable computing device 63 and PC 65 are provided together in a common device 63/65 communicating with programmable controlling device 67. Programmable controlling device 67 communicates directly within configurable hardware device 69 via a communication link. Device 63/65 includes a design tool 83, such as a CAD design tool. Design tool 83 includes configurable hardware development flow 14 and CPU program development flow 16, as previously discussed with reference to FIGS. 4 and 5.

Digital board 92 includes user application program 108 and RS-232 port 176 for communicating with device 63/65, power connector 184 for supplying power to digital board 92, a microcontroller unit (MCU) 55, an LCD display 172, application switches 178, configuration switches 180, and a reset switch 182. MCU 55 includes a central processing unit (CPU) 57, including processing circuitry.

Analog board 95 includes analog circuit elements 118, a daughterboard connector 186, AN220E04 FPAA 59, breadboard area 188, serial EEPROM sockets 190, a daisy-chain connector 192, a series of single-ended inputs 194, and a series of single-ended outputs 196.

When the user application program 118 runs on the MCU 55, the software sends configuration information to FPAA 59, thus allowing updates as needed.

Figure 7:
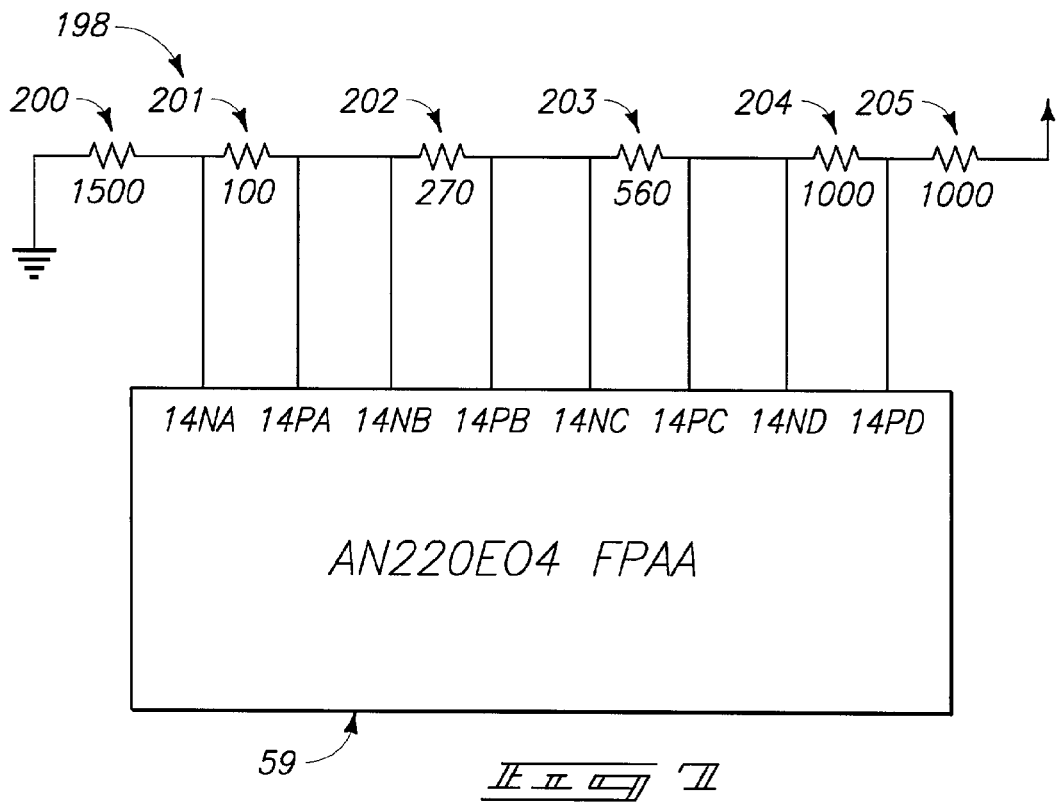
FIG. 7 is a simplified schematic diagram illustrating an exemplary resistor network circuit using the analog multiplexor (MUX) for the configurable device of FIG. 6 via the user application and design tool.

FIG. 7 depicts a resistor network that is used to illustrate use of an analog multiplexor (MUX) that is provided within FPAA 59, as well as use of an inverting gain CAM. In order to illustrate this capability, a resistor network circuit 198 is set up, after which a voltage drop is measured across several of the resistors. A basis schematic of such a network, together with connections to FPAA 59, is illustrated in FIG. 7.

As shown in FIG. 7, resistor network circuit 198 includes resistors 200–205 arranged in relationship with FPAA 59.

More particularly, input cell 4 of AN220E04 FPAA 59 is shown provided with multiple inputs. These multiple inputs can be selected either using AnadigmDesigner2, or through use of "C" code capabilities. More particularly, primary configuration is implemented from AnadigmDesigner2 which is illustrated as design tool 83 (of FIG. 6). Additional configuration can be implemented through Dynamic Update by way of user application program 108 (of FIG. 6). The ability to select multiple inputs allows the user application program to decide which resistors to measure at any particular time. By using a breadboard (breadboard area 188 of FIG. 6), a user can change resistors at any time in order to see the resulting effect on the design under consideration.

Figure 8:
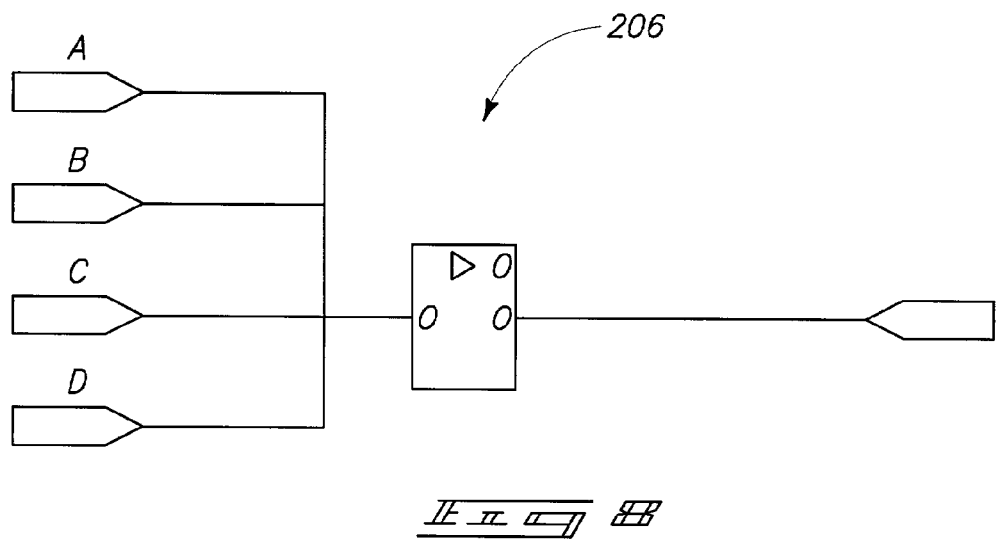
FIG. 8 is a simplified schematic diagram illustrating an analog circuitry block diagram within the analog multiplexor (MUX) of FIG. 7.

FIG. 8 illustrates details for an inverting gain CAM depicted as an inverting gain stage 206. Within the field programmable analog array of FIG. 7, inverting gain stage 206 is used in order to amplify voltage that a user measures across each input. The block diagram of FIG. 8 illustrates the layout of such an inverting gain stage, as provided by an inverting gain CAM within AnadigmDesigner2.

Figure 11:
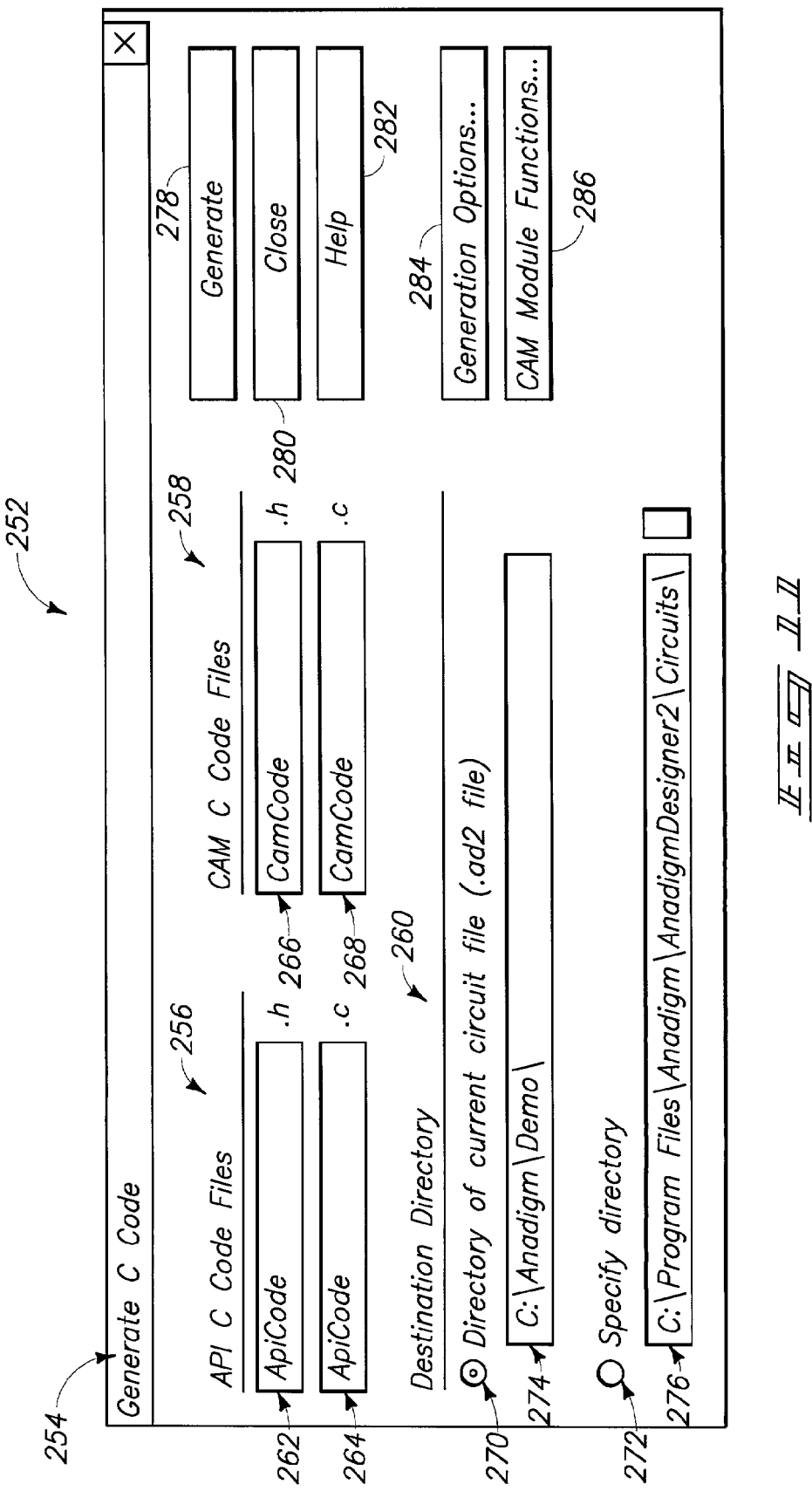
FIG. 11 is a diagram of a "C" code generation dialog box that comprises a pop-up window within the screen display of FIG. 11.

FIGS. 9–11 illustrate set-up of specific analog circuitry that will realize the inverting gain stage 206 of FIG. 8 within AnadigmDesigner2. By starting the application of AnadigmDesigner2, a user is presented with the screen display 210 depicted in FIG. 9 within a design tool application window 208. An AN220E04 FPAA chip design 220 is provided within work space 212 to enable construction of a specific chip design.

Screen display 210 includes a header 224, a menu bar 226 in which a plurality of menu items 228 are displayed for selection by a user, and a tool bar 230 in which a plurality of selectable tool bar buttons 232 are provided.

With the exception of the specific menu items 228 and 229 depicted in FIG. 9, the remaining menu items of menu bar 226 are presently available in AnadigmDesigner, an earlier version of AnadigmDesigner2. Accordingly, the functional details of such other menu items are not discussed herein in great detail in order to prevent obscuring the invention at hand. Instead, the added functionality and details provided by the "C" code menu item 228 and the "Target" menu item 229 will be discussed in greater detail below. Chip design 220 provides an initial template in which a specific chip design is generated using AnadigmDesigner2. More particularly, chip design 220 includes a plurality of input cells 234, 236, 238 and 240 as well as a plurality of output cells 242 and 244.

In order to arrive at the circuit of FIG. 10, the following steps are undertaken from the perspective of FIG. 9. First, a user double-clicks on input cell 238 and turns off a chopper amplifier and an anti-aliasing filter. This action sets input cell 238 into a bypass mode so that a user can connect the resulting inputs directly to a desired CAM corresponding with inverting gain stage 206 (of FIG. 8).

Subsequently, a user double-clicks on output cell 242 and sets the cell to a bypass mode. Furthermore, the user double-clicks on output cell 242 and also sets it to a bypass mode. Next, a user places an inverting gain CAM, corresponding with inverting gain stage 206 (of FIG. 8) onto chip 220. The user then sets the gain of the module to ten. Subsequently, using appropriate tool bar buttons 232 in tool bar 230, a user wires the output of input cell 238 to the input of the inverting gain CAM 246 (see FIG. 10). Subsequently, the user wires the output of the inverting gain CAM 246 to both output cells 242 and 244, as shown in FIG. 10. As shown in FIG. 10, the end result of such steps illustrates a wired inverting gain CAM realized by chip 220.

The specific improvements added to AnadigmDesigner2 over those presently available in publicly usable and commercially available AnadigmDesigner includes the ability to generate "C" code from the construction of a CAM, such as inverting gain CAM 246 of FIG. 10. Once specific layout of analog circuitry has been designed, a user can now generate "C" code for a desired application. By default, all CAMs and I/O cells that have "C" code capabilities are configured to generate corresponding "C" code. Such result is suitable for the purposes disclosed herein and implemented according to the present invention. By selecting the "C" code menu item 228 of FIG. 10, a pull-down menu display is generated to a plurality of options for writing configuration to various locations (not shown). For example, selection of the "C" code menu item 228 generates a pull-down menu that includes a selection item to "Generate" "C" code. Additionally, the pull-down menu includes a selection item for viewing "Generation Options". Even furthermore, the configuration pull-down menu includes a selection item for viewing "CAM Functions".

The "Generation Options" selection item (not shown) includes tailoring of generation options including general information, reconfiguration information, primary configuration information, and clock information. For example, in order to avoid possible naming collisions with existing code, every type, constant, variable, and function name may be prepended with a string. For example, all generated "C" code can be prepended with a prefix "an_" in order to avoid possible naming collisions. Furthermore, there exists an ability to tailor the truncation of names to a limited number of characters, such as by limiting names to the first 31 characters of an internal name to comply with an ANSI C standard.

Upon selecting the "Generate" selection item, a pop-up "C" code generation dialog window 252 is displayed, as shown in FIG. 11. Dialog window 252 of FIG. 11 results from selecting the "Generate" selection item from the corresponding pull-down menu of the "C" code menu item 228. Optionally, the "C" code menu item 228 can directly launch the dialog box 252 of FIG. 11, but such implementation is limited to writing configuration data in only one manner.

As shown in FIGS. 9 and 10, a "Target" menu item 229 is provided for displaying board information and/or downloading an application to a selected flash memory location. Selection of "Target" menu item 229 generates a pull-down menu that displays a selection item to "display board information". Additionally, a selection item is displayed to "download application to flash 1". Even furthermore, a selection item is displayed to "download application of flash 2". Accordingly, a user can select one of the items from the pull-down menu in order to generate the corresponding result.

By default, the resulting "C" code is saved into a directory in which a user has previously saved the circuit file. If the user desires, the user can select another location in order to save the resulting "C" code, such as by selecting the other items within the resulting pull-down menu. Furthermore, a user can change the file names, although for purposes of this example illustration, default values will be used. Upon generation of dialog window 252, a user then clicks on generate button 278. The user is then informed when the resulting "C" code has been written to the specific directory. Code resulting from such an action is illustrated by way of example in Appendix A of the present application.

As shown in FIG. 11, pop-up dialog window 252 includes a header 254, generate button 278, API "C" code files field 256, CAM "C" code files field 258, and destination directory field 260. API "C" code files field 256 includes a pair of API file entry fields 262 and 264. CAM "C" code files field 258 includes a pair of CAM file entry fields 266 and 268. Destination directory 260 includes a pair of selectable radio buttons 270 and 272. Radio button 270 includes an associated directory file entry field 274, whereas radio button 272 includes an associated directory file entry field 276.

Additionally, pop-up dialog window 252 includes a close button 280, a help button 282, a generate options button 284, and a CAM functions button 286.

As discussed in this design example, the "C" code that is generated by AnadigmDesigner2 is not necessarily useful by itself. The "C" code is typically required to be incorporated into a larger software project that will call various other code routines, as needed. For example, device information 73 is exported from design tool 83 into PC 65, as shown in FIG. 2. Within PC 65, user program 98, libraries 102, and user interface 87 enable the incorporation of other inputs into a larger project that generates CPU program 75 (of FIG. 2).

The above-described example design application also incorporates additional code into a larger project, as detailed in Appendix A. The example design application takes advantages of a design in order to switch between various inputs of input cell 238 (see FIG. 10). The example design application will also have an independent setting for the gain module for each channel. As the user switches through the channels, the gain module will be updated to respective appropriate settings. Accordingly, such example design application allows a user to control which channel is presently in use. Secondly, the application allows a user to control the gain of each channel as it is used. Thirdly, the application allows a user to have the application continually rotate through the four channels (depicted in FIG. 10). Finally, the application allows the user to calibrate the four channels to a desired output setting. The resulting example design application is disclosed in attached Appendix A, which is incorporated into the present disclosure comprising respective source code.

During the operation of the software, the example design application will need to call several functions in order to initialize the "C" code libraries, to adjust the CAMs as desired, and to generate a data stream in order to update the AN220E04 FPAA. More particularly, the example design application needs to call API and CAM "C" code functions.

First of all, the "C" code API libraries need to be initialized. This is done with a call to the InitializeReconfigData routine:

an_InitializeReconfigData(an_chip1);

This call is made on a per-chip basis, depending on which chips have reconfigurable CAMs.

Unless the chip has been configured some other way, it will probably need to be configured for the first time when the application starts up. A user can retrieve the data stream for the primary configuration with a call to the GetPrimaryConfigData routine:

PrimaryConfigPtr=(unsigned short int *)
an_GetPrimaryConfigData(an_chip1, &ConfigSize);

This retrieves a pointer to the buffer, and the size of the configuration. How the data gets to the chip depends upon the particular application. In this case, one can use the QSPI port of the HC16 to stream the data to the chip.

During software operation, if a CAM characteristic needs to be changed through "C" code, the application must call the "C" code function for that module. For the Analog MUX, one can call the setPadSelect function:

an_setPadSelect(an_chip1_InputCell4, MuxBit(ChannelLoop));

For the gain module, one can call the setGain function:

an_setGain(an_chip1_GainInv, GainMid);

To see details of these functions, a user can click on the "C" code button of the CAM characteristics in AnadigmDesigner2.

Note that the CAM functions do not change any characteristics of the chip. They only set up the configuration stream. When that stream is downloaded to the chip, then the characteristics will change.

When the application is ready to update the AN220E04 FPAA, it calls the GetReconfigData routine:

ConfigPtr=(unsigned short int *)an_GetReconfigData(an_chip1, &ConfigSize);

A user then streams the data, in this case through the QSPI port, to the chip. When the data has been transferred, a user can reset the configuration buffer by calling the ClearReconfigData routine:

an_ClearReconfigData(an_chip1);

In one particular case, it doesn't apply, but if a user needs to close out the configuration buffers (to save memory, for example), a user can call the ShutdownReconfigData routine for each chip.

After the "C" code has been incorporated into the application, a user can compile and link using whatever compiler is being used. For the HC16, one possible suitable compiler is the Cosmic C Compiler suite.

After the application has been compiled and linked, a user can download the S19 application file to the HC16 (flash memory). This is done by using the "Target->Download application to flash1" menu command in AnadigmDesigner2. A user can select the S19 file to use, and AnadigmDesigner2 then sends it down to the HC16. AnadigmDesigner2 will signal a bell tone when download is complete, and the ABK on the HC16 will show "Download App" on the LCD display.

A user now needs to hook up the resistor network to the AN220E04 FPAA, and also to test equipment in order to view the output. If a user wishes to calibrate the gain, they will need to hook up the A/D converter of the HC16 to the AN220E04 FPAA.

Next, a voltmeter should be hooked up across the output cell 1 pins, taking note of the polarity of the output. Differential outputs will be used, and differential-to-single-ended conversion circuitry will be ignored. Remove the single-ended to differential converter circuitry from the input cells by removing the J8 and J7 jumpers on the analog board.

Hook up the resistor network as shown in FIG. 7. Connect the ground of the network to the ground of the AN220E04 FPAA, and Vcc of the network to AVDD of the AN220E04 FPAA. This will provide the voltage needed for this circuit. Be sure to note the polarity of each of the inputs of input cell 4, put the negative side (i.e., I4NA) to the side of the resistor going to ground, and the positive side (i.e., I4PA) to the side of the resistor going to Vcc.

For calibrating the gain of the Analog circuitry, connect output cell 2 to the A/D circuitry of the HC16. Connect pin P2-7 of the analog board (O2P of the AN220E04 FPAA) to P5-7 of the digital board (AN0 of the HC16). Connect pin P2-8 of the analog board (O2N of the AN220E04 FPAA) to P5-5 of the digital board (AN2 of the HC16).

A user can now start the application by pressing switch S1 on the digital board. The application starts up, and proceeds to configure the AN220E04 FPAA for the presently desired design.

After configuration has been completed, the circuit operates normally, and the software now can accept user input. For our purposes, the keys of the digital board have been defined in this case. More particularly, two application switches 178 (see FIG. 6) have been redefined such that one application switch calibrates the channels and a second application switch rotates through channels (turns off other switches). Additionally, configuration switches have been defined. More particularly, a first configuration switch is defined to increment gain plus 0.5. A second configuration switch has been defined to decrement gain minus 0.5. A third configuration switch has been defined to "channel up". A fourth configuration switch has been defined to "channel down".

An LCD display 172 (see FIG. 6) is also used in order to show to a user the current status of the user application program 108 (see FIG. 6). More particularly, the LCD display shows the channel that the multiplexing unit (MUX of the FPAA) is currently set to, as well as the gain assigned for that channel.

By using the Channel Up/Down buttons (switches S5 & S6) a user can switch between the Analog MUX channels. By pressing the Gain Up/Down buttons (switches S3 & S4), a user can control the level of the gain in the module.

Pressing S1 again starts a rotation algorithm. Every second or two, the application automatically switches the Analog MUX (of the FPAA) to the next channel (or wraps around to the beginning). It also sets the gain CAM to whatever gain was last used on that channel. Press S1 again to stop the rotation. All other buttons (except Reset) are ignored while Rotation is running.

Press S2 to start a calibration sequence. The application will ask what voltage to calibrate to. Since an inverting gain CAM is being used, the output is a negative voltage. Buttons S3 through S6 control the voltage.

When a desired calibration point is achieved, press S2 again to start the calibration algorithm. As the algorithm proceeds, a user can see the work of the algorithm on the LCD display and on the voltmeter. After the calibration is complete, the LCD display will show a "Cal done!" message. A user can then return to the normal operation by pressing any button.

After calibrating, a user can go through the individual channels to see that the output is fairly consistent for each channel. If desired, a user can move the resistors around to show the voltage changes, and recalibrate to return to the desired output.

The "C" code feature of the present disclosure provides a powerful way to dynamically control CAMs within the AN220E04 FPAA. Coupled with a user's embedded software, it makes for a truly flexible analog solution.

FIG. 12 illustrates, by way of example, one method for implementing configuration or reconfiguration of analog elements provided in a configurable hardware device.

As shown in FIG. 12, a logic flow diagram illustrates the steps of implementing a configuration or reconfiguration process for analog elements within a configurable hardware device. In Step "S1", a configurable hardware device is provided communicating with a programmable controlling device. After performing Step "S1", the process proceeds to Step "S2".

In Step "S2", the system generates a hardware design including analog elements. After performing Step "S2", the process proceeds to Step "S3".

In Step "S3", the system generates computer program code that provides at least one of data and an algorithm usable in carrying out at least one of: configuring the analog elements by applying configuration data to selected memory locations within the configurable hardware device; determining a location of a subset of at least one of (i) the programmable memory locations and (ii) the configuration data to be modified; and determining a new data value to be applied to the subset of at least one of (i) the memory locations and (ii) the configuration data. After performing Step "S3", the process proceeds to Step "S4".

In Step "S4", the system exports the computer program code, including exported device information, from a programmable computing device to a compiler. After performing Step "S4", the process proceeds to Step "S5".

In Step "S5", the system maps parameter changes onto configuration data in order to enable reconfiguration of the hardware. After performing Step "S5", the process proceeds to Step "S6".

In Step "S6", the system compiles the computer program code for use by the programmable controlling device in order to enable selective modification of the configuration data for the hardware of the configurable hardware device, using the compiled program code. After performing Step "S6", the process proceeds to Step "S7".

In Step "S7", the system incorporates the computer program code into an application program for updating configuration of the configurable hardware device. After performing Step "S7", the process proceeds to Step "S8".

In Step "S8", the system delivers the application program to the programmable controlling device for reconfiguring the configurable hardware device by transferring the generated computer program code from the programmable controlling device to the configurable hardware device in order to reconfigure the hardware within the configurable hardware device. After performing Step "S8", the process proceeds to Step "S9".

In Step "S9", the system updates the configuration data of the configurable hardware device using the programmable controlling device to reconfigure the hardware of the configurable hardware device. After performing Step "S9", the process is terminated.

Figure 13B:
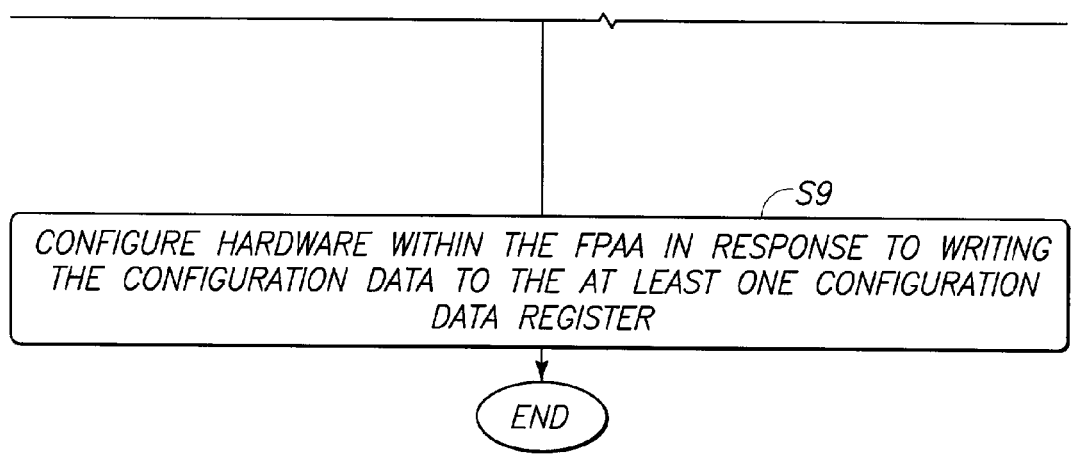

FIG. 13 illustrates, by way of example, another method for configuring a field programmable analog array. The field programmable analogy array is connected to a programmable controlling device when carrying out the method.

As shown in FIG. 13, a logic flow diagram illustrates the steps of configuring a field programmable analog array. In Step "S1", a hardware design is provided for at least one analog element within a field programmable analog array (FPAA) that is connected with a programmable controlling device. After performing Step "S1", the process proceeds to Step "S2".

In Step "S2", the system generates computer program code including at least one of a data set and a process usable to: configure the analog elements by applying configuration data to selected programmable memory locations within the FPAA; determine a location of a subset of at least one of (i) the memory locations and (ii) the configuration data to be modified; and determine a new data value to be applied to the subset of at least one of (i) the memory locations and (ii) the configuration data. After performing Step "S2", the process proceeds to Step "S3".

In Step "S3", the system generates an application program that incorporates at least in part the computer program code. The application program is operative to update configuration of the field programmable analog array. After performing Step "S3", the process proceeds to Step "S4".

In Step "S4", the system receives the application program at the programmable controlling device. After performing Step "S4", the process proceeds to Step "S5".

In Step "S5", the system embodies the computer program embodies the computer program code and algorithms that are stored in memory of the programmable controlling device. The algorithms are provided for mapping the field programmable analog array (FPAA) into a desired device configuration and/or for implementing function parameter calculations. After performing Step "S5", the process proceeds to Step "S6".

In Step "S6", with the application program, the system programs the programmable controlling device with instructions to write configuration data to at least one configuration data register within the field programmable analog array (FPAA). After performing Step "S6", the process proceeds to Step "S7".

In Step "S7", the system exports the configuration data to the field programmable analog array (FPAA) from the programmable controlling device. After performing Step "S7", the process proceeds to Step "S8".

In Step "S8", the system writes the configuration data to the at least one configuration data register of the field programmable analog array (FPAA). After performing Step "S8", the process proceeds to Step "S9".

In Step "S9", the system configures hardware within the field programmable analog array (FPAA) in response to writing the configuration data to the at least one configuration data register. After performing Step "S9", the process is terminated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A system for programming a configurable semiconductor device, comprising:
   a programmable controlling device;
   a programmable computing device;
   a communication link;
   a configurable hardware device having memory with a plurality of memory locations and coupled with the programmable controlling device via the communication link;
   a design tool comprising a first computer program code embodied in a programmable computing device; and
   a second computer program code generated at least in part by the first computer program code and embodied in the programmable controlling device for:
   a) applying a configuration data to selected memory locations within the configurable hardware device to configure the configurable hardware device;
   b) determining a location of a subset of at least one of (i) the programmable memory locations in the configurable hardware device and (ii) the configuration data to be modified; and
   c) determining a new data value to be applied to the subset of at least one of (i) the memory locations in the configurable hardware device and (ii) the configuration data;
   wherein the design tool provides at least one of a configuration data, address data, and a data value algorithm usable in performing at least one of a), b), and c).

2. The system of claim 1 wherein the design tool automatically provides at least one of configuration data, address data, and data value algorithms.

3. The system of claim 1 wherein at least one of the configuration data, address data and data value algorithms is used to perform at least one of a), b), and c).

4. The system of claim 1 wherein the programmable computing device and the programmable controlling device are provided by a common device.

5. The system of claim 1 wherein the programmable computing device comprises a stand-alone computer-aided design computer and the programmable controlling device comprises a micro-controller resident on an application board.

6. The system of claim 1 wherein the programmable controlling device is close-coupled with the configurable hardware device.

7. The system of claim 1 wherein the programmable controlling device comprises a microprocessor.

8. The system of claim 1 wherein the programmable controlling device comprises a micro-controller.

9. The system of claim 1 wherein the programmable controlling device comprises a field programmable gate array.

10. The system of claim 1 wherein the programmable controlling device comprises a digital signal processor.

11. The system of claim 1 wherein the configurable hardware device comprises a programmable logic device.

12. The system of claim 1 wherein the configurable hardware device comprises a field programmable analog array.

13. The system of claim 1 wherein the configurable hardware device comprises a field programmable gate array.

14. The system of claim 1 wherein the configurable hardware device comprises a digital signal processor.

15. The system of claim 1 wherein the programmable controlling device is configured to dynamically create modified configuration data.

16. The system of claim 1 wherein the configurable hardware device comprises configurable hardware and configuration data registers for receiving configuration data that configures the configurable hardware.

17. The system of claim 1 wherein the first computer program code comprises a controller program including algorithms operative to translate user specified parameters received by the design tool into component values and topologies.

18. The system of claim 17 wherein the algorithms comprise code routines.

19. The system of claim 18 wherein the code routines comprise 'C' language code.

20. The system of claim 18 wherein the code routines are generated to implement modification of circuits that were previously generated by a user during design of the configurable hardware using the design tool.

21. The system of claim 17 wherein the controller program includes a set of program code routines configured to implement calculation routines.

22. The system of claim 17 wherein the controller program includes a set of program code routines configured to implement configuration data assembly.

23. The system of claim 17 wherein the controller program includes a set of program code routines configured to implement check sum creation.

24. The system of claim 17 wherein the controller program includes a set of program code routines configured to implement relocation of functions within the configurable device.

25. The system of claim 24 wherein the controller program includes computer-aided design computer program code that combines place & route circuit information with the set of program code routines and generates "C" code specific to a circuit implemented by the configuration data.

26. The system of claim 25 wherein object code derived from the "C" code is capable of being directly imported via a compiler when generating the second computer program code to enable reconfiguration of the configurable device.

27. The system of claim 1 wherein the first computer program code comprises a device configuration program including algorithms operative to provide information on the configurable device to enable dynamic creation of modified configuration data for the controlling device.

28. The system of claim 17 wherein the controller program enables a user to modify circuit performance parameters from circuit performance parameters corresponding with an initial configuration of the configurable device.

29. The system of claim 17 wherein the controller program enables a user to create configuration data via the programmable controlling device that imparts new functionality to the configurable device over functionality initially imparted to the configurable device.

30. The system of claim 17 wherein the controller program enables a user to reallocate device resources to realize a configuration of the configurable device that achieves functionality equivalent to another configuration of the configurable device.

31. The system of claim 17 wherein the controller program enables creation of modified configuration data for the controlling device independent of the design tool used to originally configure the configurable device.

32. The system of claim 1 wherein the programmable controlling device is configured, after configuring the configurable hardware device, to adjust performance parameters of the configurable hardware device, and wherein the computer program code embodied in the programmable controlling device generates new configuration data to adjust performance parameters for the configurable hardware device.

33. A system for configuring a programmable device, comprising:
    a first programmable device;
    a second programmable device having configurable hardware and configuration data registers for configuring the configurable hardware, the second programmable device communicating with the first programmable device;
    a programmable computing device having a design tool with first computer program code for generating at least one of a configuration data, an address data, and algorithms; and
    second computer program code generated at least in part by the first computer program code, incorporating at least one of the generated configuration data, the address data, and algorithms for determining data values, and embodied in the first programmable device for:
    a) applying the configuration data to selected memory locations within the configurable hardware device;
    b) determining a subset of at least one of (i) the programmable memory locations in the configurable hardware device and (ii) the configuration data to be modified; and
    c) determining a new value to be applied to the subset of at least one of (i) the memory locations and (ii) the configuration data.

34. The system of claim 33 further comprising a bi-sectional communication link interposed between the first programmable device and the second programmable device.

35. The system of claim 33 wherein the first programmable device comprises a programmable controlling device.

36. The system of claim 33 wherein the second programmable device comprises a configurable hardware device.

37. The system of claim 33 wherein the first computer program code comprises a controller program including algorithms used to translate user specified parameters into component values and topologies.

38. The system of claim 33 wherein the first computer program code comprises algorithms that provide information about the configurable device to enable dynamic creation of modified configuration data for the controlling device.

39. The system of claim 33 wherein the first programmable device is programmed to write configuration data to at least one of the configuration data registers within the second programmable device in order to configure the second programmable device.

40. The system of claim 33 wherein the first programmable device is close-coupled with the second programmable device and is constructed and arranged to configure the second programmable device.

41. The system of claim 40 wherein, subsequent to configuring the second programmable device, the first programmable device is constructed and arranged to adjust at least one performance parameter for the second programmable device by modifying configuration data within the configuration data registers of the second programmable device.

42. The system of claim 40 wherein, subsequent to configuring the second programmable device, the first programmable device is constructed and arranged to render a circuit implementation for the second programmable device by enabling modification of configuration data within the configuration data registers of the second programmable device.

43. A method of implementing configuration or reconfiguration of analog elements provided in a configurable hardware device, comprising:
providing a configurable hardware device communicating with a programmable controlling device;
generating a hardware design including analog elements;
generating a computer program code that provides at least one of a data and an algorithm usable in carrying out at least one of: configuring the analog elements by applying the configuration data to selected memory locations within the configurable hardware device; determining a location of a subset of at least one of (i) the programmable memory locations and (ii) the configuration data to be modified; and determining a new data value to be applied to the subset of at least one of (i) the memory locations and (ii) the configuration data;
incorporating the computer program code into an application for updating configuration of the configurable hardware device; and
delivering the application to the programmable controlling device for reconfiguring the configurable hardware device.

44. The method of claim 43 further comprising updating the configuration data of the configurable hardware device via the programmable controlling device to reconfigure the hardware of the configurable hardware device.

45. The method of claim 43 wherein incorporating comprises compiling the computer program code for use by the programmable controlling device to enable selective modification of the configuration data for the hardware of the configurable hardware device using the compiled program code.

46. The method of claim 43 wherein the configurable hardware device comprises configurable hardware and configuration data registers for configuring the configurable hardware, and further comprising storing the generated configuration data in the configuration data registers to render reconfiguration of the configurable hardware.

47. The method of claim 43 further comprising transferring the generated computer program code from the programmable controlling device to the configurable hardware device to reconfigure the hardware within the configurable hardware device.

48. The method of claim 43 wherein the programmable controlling device includes a user interface, and further comprising receiving parameter changes from a user at the user interface that modify the configuration data for the hardware.

49. The method of claim 48 further comprising mapping the parameter changes onto the configuration data to enable reconfiguration of the hardware.

50. The method of claim 43 wherein generating computer program code comprises incorporating data values representing changes to an analog circuit element of the configurable hardware device to be applied to the configuration data for configuring the hardware.

51. The method of claim 43 further comprising automatically providing information about placement of hardware components within the configurable hardware device to the programmable controlling device.

52. The method of claim 43 wherein the configurable hardware device comprises a field programmable analog array, and further comprising reconfiguring at least one analog element of the field programmable analog array in response to launching the application program from the programmable controlling device to the configurable hardware device so as to write configuration data to configuration data registers of the field programmable analog array.

53. The method of claim 52 further comprising modifying the configuration data for the field programmable analog array using the generated computer program code in combination with user input in order to reconfigure the at least one analog element.

54. A method of configuring a field programmable analog array, the field programmable analog array being connected to a programmable controlling device, comprising:
providing a hardware design for at least one analog element within the field programmable analog array;
generating a computer program code including at least one of a data set and a process usable to: configure the analog elements by applying a configuration data to selected programmable memory locations within the field programmable analog array; determine a location of a subset of at least one of (i) the memory locations and (ii) the configuration data to be modified; and determine a new data value to be applied to the subset of at least one of (i) the memory locations and (ii) the configuration data;
generating an application program incorporating at least in part the computer program code operative to update configuration of the field programmable analog array;
receiving the application program at the programmable controlling device;
with the application program, programming the programmable controlling device with instructions to write configuration data to at least one configuration data register within the field programmable analog array;
writing the configuration data to the at least one configuration data register of the field programmable analog array; and
configuring hardware within the field programmable analog array in response to writing the configuration data to the at least one configuration data register.

55. The method of claim 54 further comprising exporting configuration data to the field programmable analog array from the programmable controlling device.

56. The method of claim 54 wherein the application program comprises device specific mapping information.

57. The method of claim 56 further comprising embodying computer program code in algorithms stored in memory of the programmable controlling device for mapping the field programmable analog array into a desired device configuration.

58. The method of claim 54 wherein the application program comprises design-to-device mapping information.

59. The method of claim 58 wherein the design-to-device mapping information comprises hardware configuration data, design-to-device memory map data, and design modification algorithms.

60. The method of claim 54 wherein the application program comprises design specific mapping information.

61. The method of claim 60 further comprising embodying computer program code in algorithms stored in memory of the programmable controlling device for implementing function parameter calculations.

62. A method in a computer system for reconfiguring an analog hardware in a configurable hardware device, the method comprising:
providing an analog hardware design;
rendering a computer program code that automatically incorporates at least one of algorithms and data usable in performing at least one of the following operations:

a) configuring the analog elements by applying a configuration data to selected memory locations within the configurable hardware device;
b) determining a location of a subset of at least one of (i) the programmable memory locations and (ii) the configuration data to be modified; and
c) determining a new data value to be applied to the subset of at least one of (i) the memory locations and (ii) the configuration data;

rendering an application program based at least in part on the computer program code for updating configuration of the configurable hardware device;

communicating with a configurable hardware device via the programmable controlling device, the configurable hardware device having configuration data within at least one configuration data register for configuring analog hardware within the configurable hardware device;

receiving user input at the programmable controlling device comprising instructions that cooperate with the application program to write new configuration data to a configuration data register within the configurable hardware device;

writing the new configuration data to the at least one configuration data register; and reconfiguring the analog hardware within the configurable hardware device using the new configuration data.

63. The method of claim 62 wherein the configurable hardware device comprises a field programmable analog array.

64. The method of claim 62 wherein the computer program code includes exported device information for use by the programmable controlling device to reconfigure the analog hardware of the configurable hardware device.

65. The method of claim 62 further comprising storing the new configuration data in the configuration data registers to reconfigure the analog hardware.

66. The method of claim 62 wherein writing the new configuration data comprises transferring computer data from the programmable controlling device to the configurable hardware device to reconfigure the hardware within the configurable hardware device.

67. The method of claim 62 wherein user input is received via a user program of the programmable controlling device, and wherein the user input is combined with configuration data from a computer-aided design tool that includes a user functional description of an analog circuit.

68. A method in a computer system for reconfiguring a configurable hardware device, comprising:
providing a programmable controlling device in communication with the configurable hardware device;
receiving a computer program code at the programmable controlling device that incorporates at least one of algorithms and data usable to: configure the analog elements by applying a configuration data to selected memory locations within the configurable hardware device; determine a location of a subset of at least one of (i) the programmable memory locations and (ii) the configuration data to be modified; and determine a new data value to be applied to the subset of at least one of (i) the memory locations and (ii) the configuration data; and
receiving user input at the programmable controlling device; and
using the computer program code and the user input, reconfiguring the configurable hardware device from a first configuration to a second configuration.

69. The method of claim 68 further comprising programming the programmable controlling device with instructions to write configuration data to at least one configuration data register within the configurable hardware device.

70. The method of claim 68 further comprising providing device information for the configurable hardware device to the programmable controlling device to enable the programmable controlling device to write configuration data to data registers within the configurable hardware device to configure the configurable hardware device into the second configuration.

71. The method of claim 70 wherein exporting device information comprises exporting configuration data for the configurable hardware device.

72. The method of claim 71 wherein exporting configuration data comprises exporting a configuration file comprising data representing a circuit.

73. The method of claim 72 wherein the configuration file comprises a map file comprising a set of data having a corresponding relationship with another set of data.

74. A method of configuring a field programmable analog array, the field programmable analog array being connected to a host processor for configuration thereby, the method comprising:
with a design tool, generating a first computer program code that provides at least one of a configuration data, address data, and algorithms;
generating a second computer program code using at least part of the first computer program code;
transferring the second computer program code to the host processor;
configuring the field programmable analog array by applying a configuration data to selected memory locations within the configurable hardware device;
determining a location of a subset of at least one of (i) the programmable memory locations and (ii) the configuration data to be modified;
determining a new data value to be applied to the subset of at least one of (i) the memory locations and (ii) the configuration data; and
receiving user input at the host processor comprising new configuration data.

75. The method of claim 74 further comprising writing the new configuration data to the configuration data registers within the field programmable analog array.

76. The method of claim 75 further comprising reconfiguring the field programmable analog array according to the new configuration data.

77. The method of claim 74 wherein, prior to programming the programmable controlling device, configuring the field programmable analog array with an initial set of configuration data.

78. The method of claim 75 wherein, after configuring the field programmable analog array, reconfiguring the field programmable analog array by overwriting at least part of the initial set of configuration data with the new configuration data.

79. The method of claim 74 wherein writing the new configuration comprises dynamically updating the new configuration data to the configuration data register to dynamically reconfigure the field programmable analog array.

80. The method of claim 74 wherein the first computer program code automatically provides at least one of configuration data, address data, and algorithms.

81. A system for programming a configurable semiconductor device, comprising:
 a programmable semiconductor device specifically constructed to accept programming data that configures a configurable semiconductor device to:
 a) configure the configurable semiconductor device by applying a configuration data to selected memory locations within the configurable semiconductor device;
 b) determine a location of a subset of at least one of (i) the programmable memory locations and (ii) the configuration data to be modified;
 c) determine a new data value to be applied to the subset of at least one of (i) the memory locations and (ii) the configuration data; and
 d) enable a user to interact via a programmable controlling device coupled with the programmable semiconductor device to reconfigure at least one analog component of the programmable semiconductor device.

82. The system of claim 81 wherein the programmable semiconductor device comprises a field programmable analog array.

* * * * *